US012813113B2

(12) United States Patent
Du et al.

(10) Patent No.: US 12,813,113 B2
(45) Date of Patent: *Nov. 24, 2026

(54) DISPLAY SUBSTRATE AND DISPLAY DEVICE HAVING COMPENSATION SIGNAL LINES COUPLED TO INITIALIZATION SIGNAL BUSES

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Mengmeng Du, Beijing (CN); Rong Wang, Beijing (CN); Changlong Yuan, Beijing (CN); Xiangdan Dong, Beijing (CN); Rui Hou, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 19/238,909

(22) Filed: Jun. 16, 2025

(65) Prior Publication Data

US 2025/0311575 A1 Oct. 2, 2025

Related U.S. Application Data

(63) Continuation of application No. 18/558,524, filed as application No. PCT/CN2022/105456 on Jul. 13, 2022, now Pat. No. 12,369,471.

(30) Foreign Application Priority Data

Jul. 30, 2021 (CN) ........................ 202110870709.7

(51) Int. Cl.
*H10K 59/131* (2023.01)
*G09G 3/3225* (2016.01)
*H10K 59/121* (2023.01)

(52) U.S. Cl.
CPC ......... *H10K 59/131* (2023.02); *G09G 3/3225* (2013.01); *H10K 59/1213* (2023.02);
(Continued)

(58) Field of Classification Search
CPC ... G09G 2300/0408; G09G 2300/0426; G09G 2300/0819; G09G 2300/0842;
(Continued)

(56) References Cited

U.S. PATENT DOCUMENTS

2018/0130410 A1* 5/2018 Gao ..................... G09G 3/3225
2021/0225265 A1* 7/2021 Hong ....................... G09G 3/32
(Continued)

FOREIGN PATENT DOCUMENTS

CN 111682054 A 9/2020
CN 111968577 A 11/2020
CN 112885850 A 6/2021

OTHER PUBLICATIONS

First Chinese Office Action for Chinese Patent Application No. 202110870709.7 mailed Jul. 24, 2025. 11 pages.

*Primary Examiner* — Richard J Hong
(74) *Attorney, Agent, or Firm* — BROOKS KUSHMAN P.C.

(57) ABSTRACT

A display substrate and a display device. A sub-pixel in the display substrate comprises: a first initialization signal line and a second initialization signal line, the potentials of initialization signals transmitted by the first initialization signal line and the second initialization signal line being different; a sub-pixel driving circuit in the sub-pixel comprises a drive transistor, a first reset transistor and a second
(Continued)

reset transistor; a first electrode of the drive transistor is coupled to a light-emitting element; a first electrode of the first reset transistor is coupled to a gate electrode of the drive transistor, and a second electrode of the first reset transistor is coupled to the first initialization signal line; a first electrode of the second reset transistor is coupled to the light-emitting element, and a second electrode of the second reset transistor is coupled to the second initialization signal line.

19 Claims, 15 Drawing Sheets

(52) U.S. Cl.
CPC . *H10K 59/1216* (2023.02); *G09G 2300/0408* (2013.01); *G09G 2300/0426* (2013.01); *G09G 2300/0819* (2013.01); *G09G 2300/0842* (2013.01); *G09G 2320/0233* (2013.01); *G09G 2320/0257* (2013.01); *G09G 2330/00* (2013.01)

(58) Field of Classification Search
CPC ... G09G 2320/0233; G09G 2320/0257; G09G 2330/00; G09G 3/3225; G09G 3/3233; G09G 3/3275; G09G 3/32; H10K 59/121; H10K 59/1213; H10K 59/1216; H10K 59/131; H10D 86/0221
See application file for complete search history.

(56) References Cited

U.S. PATENT DOCUMENTS

| | | | | |
|---|---|---|---|---|
| 2021/0335989 | A1* | 10/2021 | Diao | G09G 3/3225 |
| 2021/0359058 | A1* | 11/2021 | Cho | H10D 86/0221 |
| 2022/0122547 | A1* | 4/2022 | Yu | G09G 3/3275 |
| 2023/0097504 | A1* | 3/2023 | Liu | H10K 59/131 257/72 |

* cited by examiner

DISPLAY SUBSTRATE AND DISPLAY DEVICE HAVING COMPENSATION SIGNAL LINES COUPLED TO INITIALIZATION SIGNAL BUSES

CROSS-REFERENCE TO RELATED APPLICATIONS

This application is a continuation of U.S. application Ser. No. 18/558,524 filed on Nov. 1, 2023, which is the U.S. national phase of PCT Application No. PCT/CN2022/105456 filed on Jul. 13, 2022, which claims priority to Chinese Patent Application No. 202110870709.7 filed on Jul. 30, 2021, which are incorporated herein by reference in their entireties.

TECHNICAL FIELD

The present disclosure relates to the field of display technology, and more particularly, to a display substrate and a display device.

BACKGROUND

The AMOLED (Active-Matrix Organic Light-Emitting Diode) displays have the advantages such as self-luminescence, wide color gamut, high contrast, light and thin, which have been widely used in small-sized and medium-sized display products such as mobile phones, wearable electronic devices and vehicles.

Since the display brightness of a medium-sized or large-sized display product is much higher than that of a small-sized display product, the medium-sized and large-sized display products place higher demands on the display brightness. However, the enhancement of the display brightness can be realized by setting a negative power supply signal at a lower potential, and in the case of setting a negative power supply signal to be a lower potential, an initialization signal needs to be set at the lower potential to ensure the black state brightness of the display product. However, setting the initialization signal at a lower potential may cause an increase in the leakage of the gate electrode of the drive transistor in a sub-pixel driving circuit, adversely affecting the display quality of the display product.

SUMMARY

The objective of the present disclosure is to provide a display substrate and a display device.

In order to achieve the above objective, the present disclosure provides the following technical solutions.

In a first aspect of the present disclosure, a display substrate is provided, including a base substrate and a plurality of sub-pixels on the base substrate. The sub-pixel includes:

- a first initialization signal line and a second initialization signal line, where a potential of a first initialization signal transmitted by the first initialization signal line is different from a potential of a second initialization signal transmitted by the second initialization signal line; and
- a sub-pixel driving circuit and a light-emitting element, where the sub-pixel driving circuit includes a drive transistor, a first reset transistor and a second reset transistor; a first electrode of the drive transistor is coupled to the light-emitting element; a first electrode of the first reset transistor is coupled to a gate electrode of the drive transistor, and a second electrode of the first reset transistor is coupled to the first initialization signal line; a first electrode of the second reset transistor is coupled to the light-emitting element, and a second electrode of the second reset transistor is coupled to the second initialization signal line.

Optionally, at least part of the first initialization signal line extends in a first direction; at least part of the second initialization signal line extends in the first direction; the sub-pixel further includes: a first compensation signal line and/or a second compensation signal line; the first compensation signal line is coupled to the first initialization signal line, at least part of the first compensation signal line extends in a second direction, the second direction intersecting the first direction; the second compensation signal line is coupled to the second initialization signal line, and at least part of the second compensation signal line extends in the second direction.

Optionally, the sub-pixel further includes: a data line, at least part of the data line extending in the second direction; in a same one of the sub-pixels, an orthographic projection of the gate electrode of the drive transistor onto the base substrate is located between an orthographic projection of the data line onto the base substrate and an orthographic projection of the first compensation signal line onto the base substrate; and is located between the orthographic projection of the data line onto the base substrate and an orthographic projection of the second compensation signal line onto the base substrate; the first compensation signal line and the second compensation signal line are arranged in a same layer and made of a same material as the data line.

Optionally, the sub-pixel further includes: a data line, at least part of the data line extending in the second direction; in a same one of the sub-pixels, an orthographic projection of the data line onto the base substrate is located between an orthographic projection of the gate electrode of the drive transistor onto the base substrate and an orthographic projection of the first compensation signal line onto the base substrate; and is located between the orthographic projection of the gate electrode of the drive transistor onto the base substrate and an orthographic projection of the second compensation signal line onto the base substrate; the first compensation signal line and the second compensation signal line are arranged in a same layer and made of a same material as the data line.

Optionally, the plurality of sub-pixels are distributed in an array, and in sub-pixels in the same row in the first direction, first initialization signal lines are coupled; in sub-pixels in the same column in the second direction, first compensation signal lines are coupled; and/or, in the sub-pixels in the same row in the first direction, second initialization signal lines are coupled; in the sub-pixels in the same column in the second direction, the second compensation signal lines are coupled.

Optionally, the display substrate includes a display area and a peripheral area surrounding the display area; the display substrate further includes:

- a first initialization signal bus, where the first initialization signal bus is arranged in the peripheral area, at least part of the first initialization signal bus extends in the second direction, and the first initialization signal line is coupled to the first initialization signal bus; and/or
- a second initialization signal bus, where the second initialization signal bus is arranged in the peripheral area, at least part of the second initialization signal bus extends in the second direction, and the second initialization signal line is coupled to the second initialization signal bus.

Optionally, the first initialization signal bus surrounds the display area; the first compensation signal line is coupled to the first initialization signal bus; and/or the second initialization signal bus surrounds the display area; the second compensation signal line is coupled to the second initialization signal bus.

Optionally, the sub-pixel further includes: the sub-pixel further includes: a first reset signal line, and at least part of the first reset signal line extends in the first direction; the first reset transistor includes a first gate pattern and a first active pattern; the first gate pattern is coupled to the first reset signal line, the first gate pattern is of a U-shaped structure, and an opening of the U-shaped structure faces the data line; an orthographic projection of the first active pattern onto the base substrate at least partially overlaps an orthographic projection of portions of the first gate pattern onto the base substrate, where the portions of the first gate pattern are portions of the first gate that are located at two sides of the opening.

Optionally, the first active pattern includes the first electrode and the second electrode of the first reset transistor; the sub-pixel further includes: a first conductive connecting part, and the first conductive connecting part includes a first portion and a second portion; the first portion is coupled to the first initialization signal line and the first compensation signal line, and the second portion is coupled to the second electrode of the first reset transistor.

Optionally, the sub-pixel further includes: a second reset signal line, and at least part of the second reset signal line extends in the first direction; the second reset transistor includes a second gate pattern and a second active pattern; the second gate pattern is coupled to the second reset signal line, and at least part of the second gate pattern extends in the first direction; the second active pattern, the second gate pattern, and the second reset signal line are stacked in sequence in a direction away from the base substrate.

Optionally, the second active pattern includes the first electrode and the second electrode of the second reset transistor; the sub-pixel further includes: a second conductive connecting part, the second conductive connecting part includes a third portion and a fourth portion, the third portion is coupled to the second initialization signal line and the second compensation signal line, and the fourth portion is coupled to the second electrode of the second reset transistor.

Optionally, the sub-pixel further includes: a gate line, at least part of the gate line extending in the first direction; the sub-pixel driving circuit further includes:

- a compensation transistor including a third gate pattern and a third active pattern; the third gate pattern is coupled to the gate line, the third gate pattern includes a fifth portion and a sixth portion, the sixth portion extends in the first direction, the fifth portion extends in the second direction, and an orthographic projection of the third active pattern onto the base substrate at least partially overlaps an orthographic projection of the sixth portion onto the base substrate and an orthographic projection of the fifth portion onto the base substrate;
- a data write transistor including a fourth gate pattern and a fourth active pattern; the fourth gate pattern is coupled to the gate line, the fourth gate pattern extends in the first direction, and the fourth active pattern is coupled to the data line and a second electrode of the drive transistor.

Optionally, the third active pattern includes a first sub-pattern, a second sub-pattern and a third sub-pattern; an orthographic projection of the first sub-pattern onto the base substrate at least partially overlaps an orthographic projection of the sixth portion onto the base substrate; an orthographic projection of the second sub-pattern onto the base substrate at least partially overlaps an orthographic projection of the fifth portion onto the base substrate; the third sub-pattern is located between the first sub-pattern and the second sub-pattern, and is coupled to the first sub-pattern and the second sub-pattern;

- the sub-pixel further includes: a power supply line including a portion extending in the first direction;
- the sub-pixel driving circuit further includes a storage capacitor, the storage capacitor includes a first plate and a second plate that are oppositely arranged, the first plate is located between the second plate and the base substrate, the first plate is coupled to the gate electrode of the drive transistor, the second plate is coupled to the power supply line, and an orthographic projection of the second plate onto the base substrate at least partially overlaps the orthographic projection of the third sub-pattern onto the base substrate.

Optionally, the sub-pixel driving circuit further includes:

- a compensation transistor including a third active pattern;
- a storage capacitor, where the storage capacitor includes a first plate and a second plate that are oppositely arranged, the second plate includes a plate body and a plate shielding part, an orthographic projection of the plate body onto the base substrate at least partially overlaps an orthographic projection of the first plate onto the base substrate, an orthographic projection of the plate shielding part onto the base substrate at least partially overlaps an orthographic projection of the third active pattern onto the base substrate;
- the orthographic projection of the plate shielding part onto the base substrate does not overlap the orthographic projection of the first compensation signal line onto the base substrate; and/or the orthographic projection of the plate shielding part onto the base substrate does not overlap the orthographic projection of the second compensation signal line onto the base substrate.

Optionally, in the same sub-pixel, the orthographic projection of the first compensation signal line onto the base substrate is located between the orthographic projection of the plate shielding part onto the base substrate and the orthographic projection of the second compensation signal line onto the base substrate.

Optionally, the sub-pixel further includes: a power supply line; the power supply line includes a first power supply pattern, a second power supply pattern and a third power supply pattern; the first power supply pattern and the second power supply pattern both extend in the first direction, and the third power supply pattern extends in the second direction; the second power supply pattern is coupled to the first power supply pattern and the third power supply pattern; the second power supply pattern is coupled to the second plate.

Optionally, the sub-pixel further includes: a light-emitting control signal line, and the light-emitting control signal line includes at least a portion extending in the first direction; the third power supply pattern includes a first power supply sub-pattern and a second power supply sub-pattern, and a width of the first power supply sub-pattern in the first direction is smaller than a width of the second power supply sub-pattern in the first direction; an orthographic projection of the first power supply sub-pattern onto the base substrate at least partially overlaps an orthographic projection of the light-emitting control signal line onto the base substrate.

Optionally, an orthographic projection of the second power supply pattern onto the base substrate is located within the orthographic projection of the plate body onto the base substrate.

Optionally, the sub-pixel further includes: a light-emitting control signal line, where at least part of the light-emitting control signal line extends in the first direction, and an orthographic projection of the light-emitting control signal line onto the base substrate at least partially overlaps an orthographic projection of the third power supply pattern onto the base substrate. The sub-pixel driving circuit further includes:

- a power supply control transistor, where a gate electrode of the power supply control transistor is coupled to the light-emitting control signal line, a first electrode of the power supply control transistor is coupled to the second electrode of the drive transistor, and a second electrode of the power supply control transistor is coupled to the third power supply pattern;
- a light-emitting control transistor, where a gate electrode of the light-emitting control transistor is coupled to the light-emitting control signal line, a first electrode of the light-emitting control transistor is coupled to the light-emitting element, and a second electrode of the light-emitting control transistor is coupled to the first electrode of the drive transistor.

Optionally, the display substrate further includes a first source and drain metal layer; the first reset signal line, the second reset signal line, the gate line, the power supply line, the first conductive connecting part and the second conductive connecting part are arranged in a same layer and made of a same material as the first source and drain metal layer.

Based on the above-mentioned technical solution of the display substrate, a second aspect of the present disclosure provides a display device including the above-mentioned display substrate.

BRIEF DESCRIPTION OF THE DRAWINGS

The accompanying drawings are included to provide a further understanding of the present disclosure and constitute a part of the present disclosure, which illustrate embodiment(s) of the present disclosure and together with the description serve to explain the disclosure and do not constitute an undue limitation of the disclosure. In the drawings.

DETAILED DESCRIPTION

Figure 1:
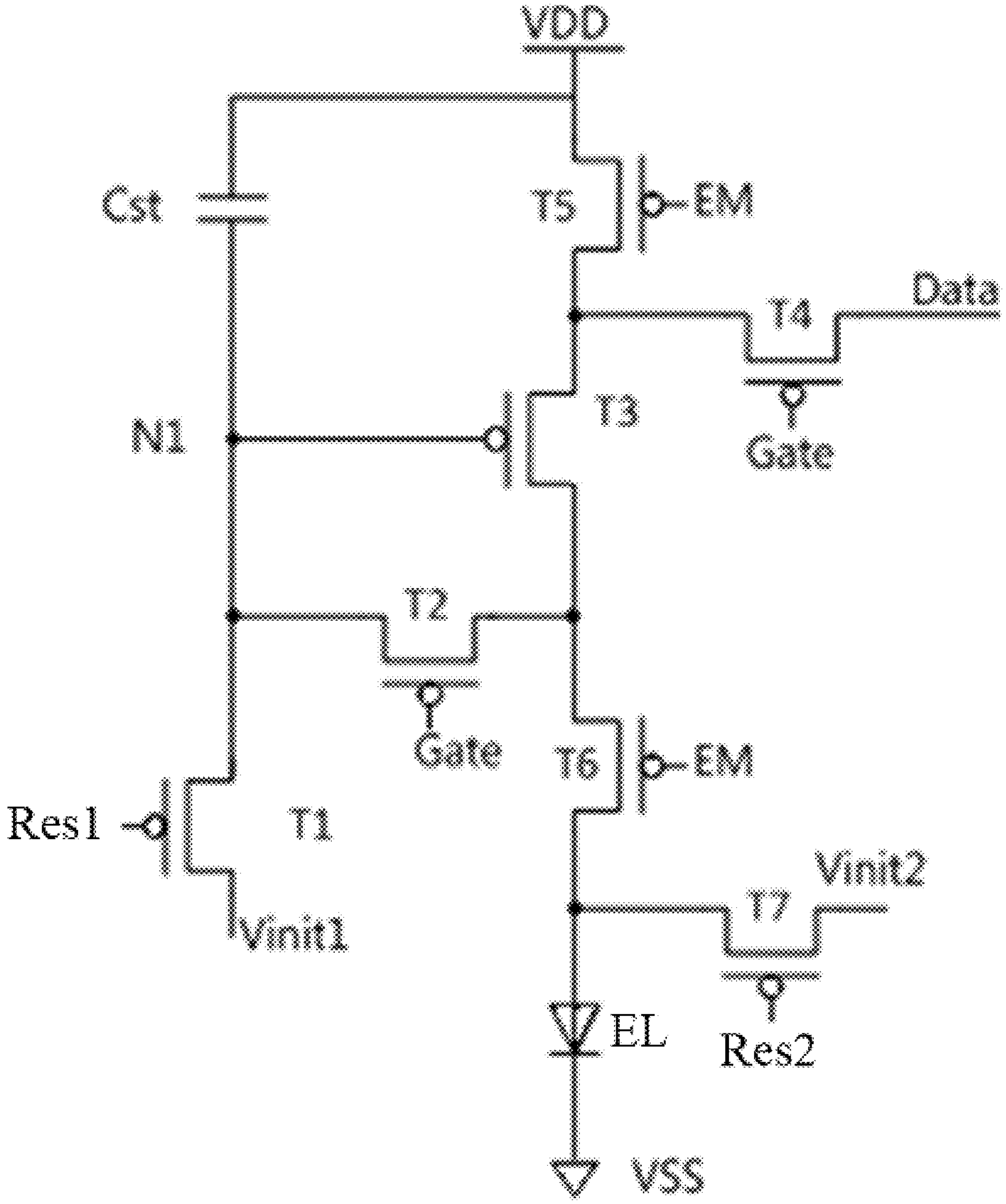
FIG. 1 is a schematic diagram of a sub-pixel driving circuit provided in an embodiment of the present disclosure.
Figure 2:
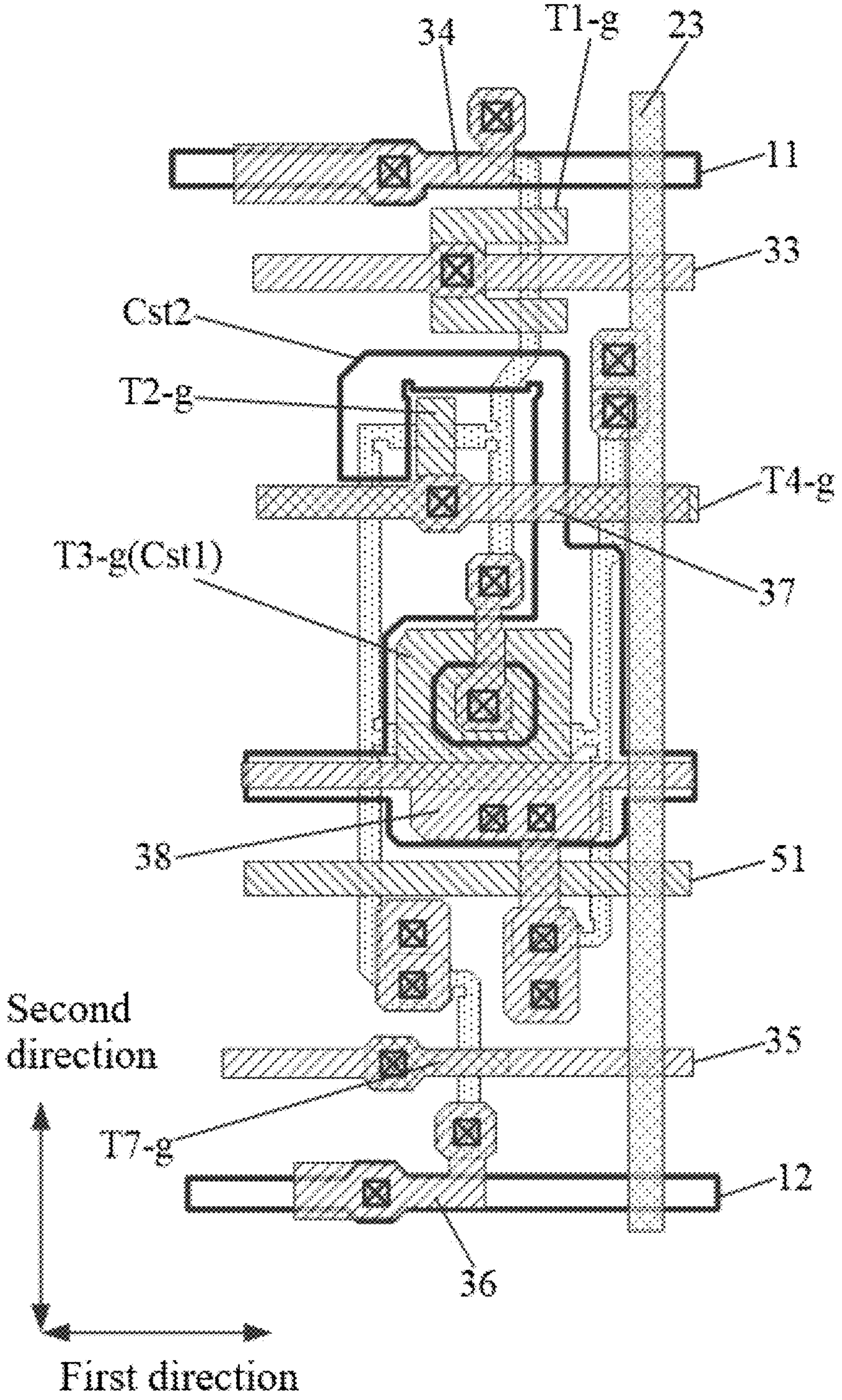
FIG. 2 is a schematic diagram of a first layout of sub-pixels provided an embodiment of the present disclosure.
Figure 3:
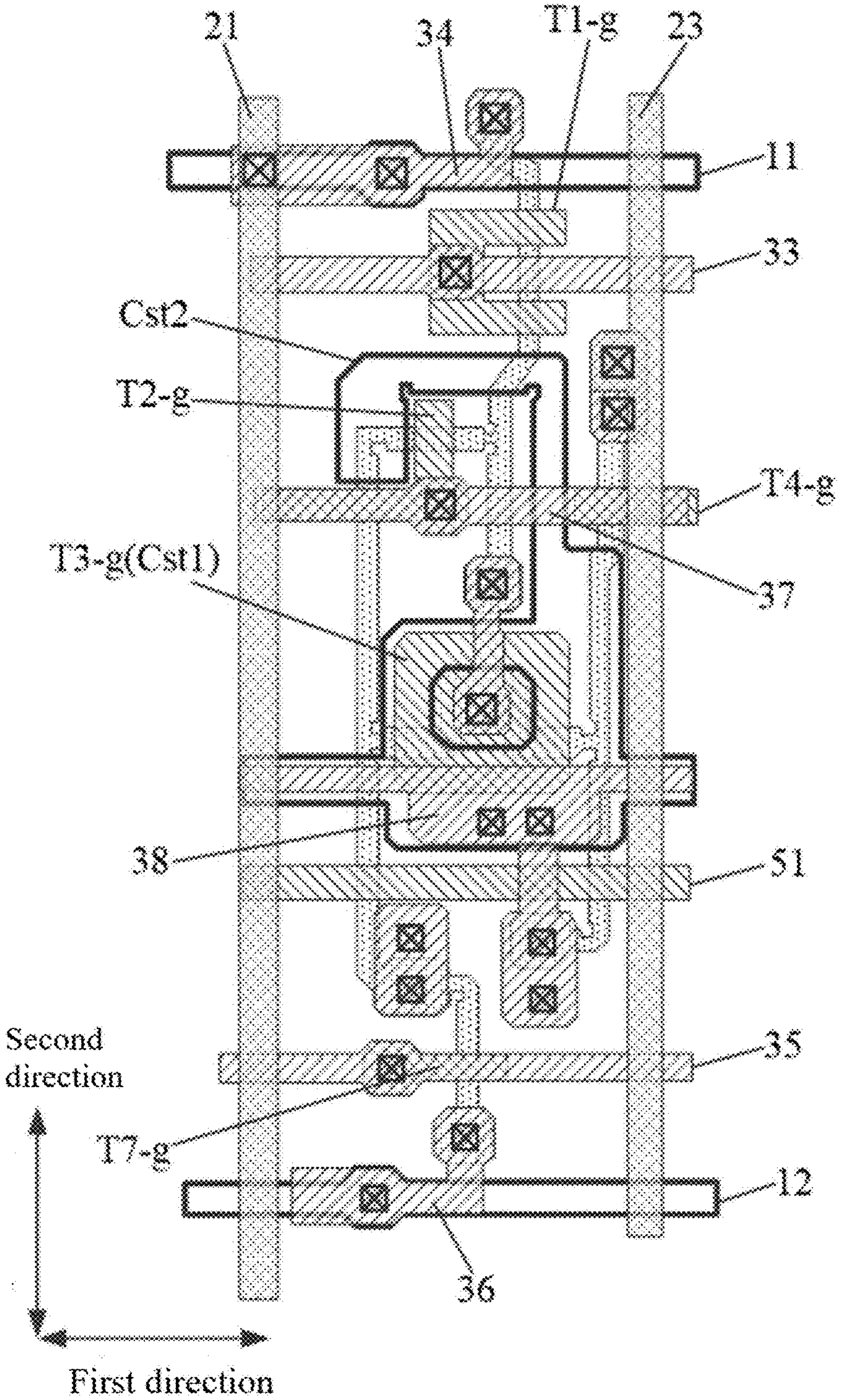
FIG. 3 is a schematic diagram of a second layout of sub-pixels provided by an embodiment of the present disclosure.
Figure 4:
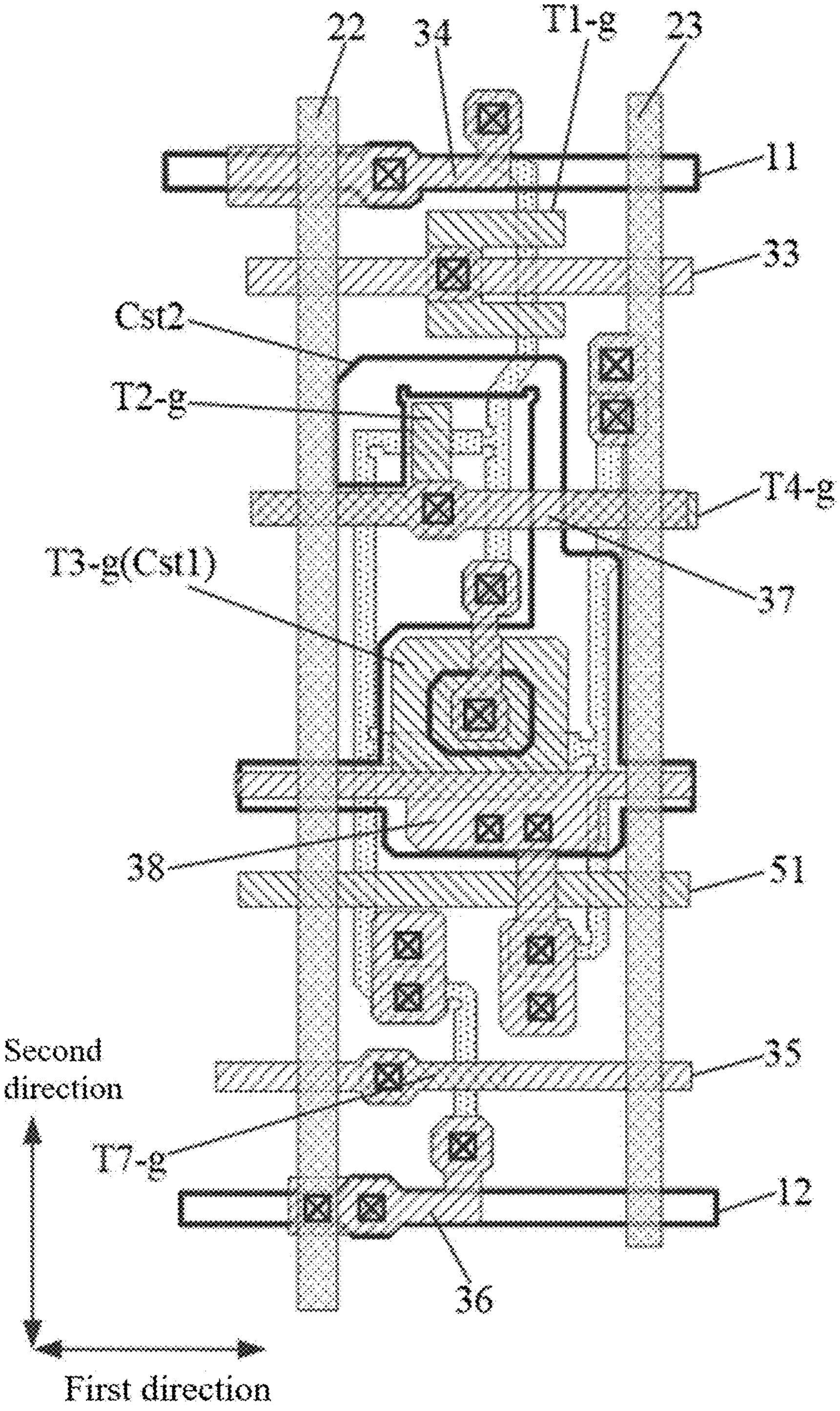
FIG. 4 is a schematic diagram of a third layout of sub-pixels provided by an embodiment of the present disclosure.

In order to further explain the display substrate and the display device provided by the embodiments of the present disclosure, a detailed description will be given below with reference to the accompanying drawings.

With reference to FIGS. 1, 2, 5 and 6, an embodiment of the present disclosure provides a display substrate, including: a base substrate and a plurality of sub-pixels disposed on the base substrate. The sub-pixel includes:

- a first initialization signal line 11 and a second initialization signal line 12, where a potential of a first initialization signal transmitted by the first initialization signal line 11 is different from a potential of a second initialization signal transmitted by the second initialization signal line 12; and
- a sub-pixel driving circuit and a light-emitting element EL, where the sub-pixel driving circuit includes a drive transistor T3, a first reset transistor T1 and a second reset transistor T7; a first electrode T3-*s*1 of the drive transistor T3 is coupled to the light-emitting element EL; a first electrode T1-*s*1 of the first reset transistor T1 is coupled to a gate electrode T3-*g* of the drive transistor T3 (i.e., N1), and a second electrode T1-*s*2 of the first reset transistor T1 is coupled to the first initialization signal line 11; a first electrode T7-*s*1 of the second reset transistor T7 is coupled to the light-emitting element EL, and a second electrode T7-*s*2 of the second reset transistor T7 is coupled to the second initialization signal line 12.

Illustratively, the first initialization signal line 11 and the second initialization signal line 12 are independent of each other, the first initialization signal line 11 is used for providing a first initialization signal, the second initialization signal line 12 is used for providing a second initialization signal, the first initialization signal and the second initialization signal are independently adjustable.

By way of example, the sub-pixel includes a sub-pixel driving circuit and a light-emitting element EL. The sub-pixel driving circuit includes a 7T1C (i.e., 7 transistors and one capacitor) circuit, and the light-emitting element EL includes an anode layer, a light-emitting functional layer and a cathode layer, which are stacked in sequence in a direction away from the base substrate. The anode layer is coupled to the sub-pixel driving circuit and is capable of receiving a drive signal provided by the sub-pixel driving circuit.

Illustratively, the sub-pixel driving circuit includes a drive transistor T3 having a first electrode T3-*s*1 coupled to the anode layer of the light-emitting element EL.

Illustratively, the sub-pixel driving circuit further includes a first reset transistor T1, a gate electrode (namely, a first gate pattern T1-*g*) of the first reset transistor T1 is coupled to a first reset signal line 33, a first electrode T1-*s*1 of the first reset transistor T1 is coupled to a gate electrode T3-*g* of the drive transistor T3, and a second electrode T1-*s*2 of the first reset transistor T1 is coupled to the first initialization signal line 11. Under the control of the first reset signal Res1 provided by the first reset signal line 33, the first reset transistor T1 is turned on or off to realize whether to reset the gate electrode T3-*g* of the drive transistor T3.

Illustratively, the sub-pixel driving circuit further includes a second reset transistor T7, a gate electrode of the second reset transistor T7 is coupled to a second reset signal line 35, a first electrode T7-*s*1 of the second reset transistor T7 is coupled to the anode layer of the light-emitting element EL, and a second electrode T7-*s*2 of the second reset transistor T7 is coupled to the second initialization signal line 12. The second reset transistor T7 is turned on or off under the control of a second reset signal provided by the second reset signal line 35, to realize whether to reset the anode layer of the light-emitting element EL.

Note that, in order to increase the light emission brightness of the sub-pixel, it is necessary to increase the voltage difference between the positive power supply signal and the negative power supply signal received by the sub-pixel driving circuit. When the voltage of the negative power supply signal is reduced, it is necessary to simultaneously reduce the voltage of the initialization signal for resetting the light-emitting element EL, so as to ensure the black state brightness of the light-emitting element EL in low-gray-scale display. If the first reset transistor T1 and the second reset transistor T7 receive the same initialization signal, the voltage of the initialization signal for resetting the gate electrode T3-*g* of the drive transistor T3 will be reduced at the same time, resulting in an increased leakage of the gate electrode T3-*g* of the drive transistor T3, adversely affecting the white brightness of the display product when displaying in a high gray scale.

According to the specific structure of the display substrate, it can be seen that in the display substrate provided in the embodiments of the present disclosure, the first initialization signal Vinit1 provided by the first initialization signal line 11 is used to reset the gate electrode T3-*g* of the drive transistor T3, and the second initialization signal Vinit2 provided by the second initialization signal line 12 is used to reset the light-emitting element EL; so that the first initialization signal Vinit1 for resetting the gate electrode T3-*g* of the drive transistor T3 and the second initialization signal Vinit2 for resetting the light-emitting element EL are independent from each other, independent control can be realized, and different voltage values can be provided, so as to avoid increasing the leakage of the gate electrode T3-*g* of the drive transistor T3 while ensuring the black-state brightness of the light-emitting element EL in, and to ensure the white-state brightness of the light-emitting element EL when displaying at a high gray scale. Therefore, when the display substrate provided by the embodiments of the present disclosure is applied to a display device, defects such as a residual image and a first frame response time of the display device can be improved, and a mura defect occurring at the time of low-gray-scale display can also be improved, thereby ensuring the brightness uniformity of a picture of the display device at the time of a high-gray-scale display and low-gray-scale display.

As shown in FIG. 1, FIG. 3, FIG. 4, FIG. 5, and FIG. 11, in some embodiments, at least part of the first initialization signal line 11 extends in a first direction. At least part of the second initialization signal line 12 extends in the first direction. The sub-pixel further includes: a first compensation signal line 21 and/or a second compensation signal line 22; the first compensation signal line 21 is coupled to the first initialization signal line 11, at least part of the first compensation signal line 21 extends in a second direction, the second direction intersecting the first direction; the second compensation signal line 22 is coupled to the second initialization signal line 12, at least part of the second compensation signal line 22 extends in the second direction.

Illustratively, the first direction includes a transverse direction and the second direction includes a longitudinal direction.

Illustratively, the first initialization signal line 11 and the second initialization signal line 12 are arranged in the same layer and made of the same material, the first compensation signal line 21 and the second compensation signal line 22 are arranged in the same layer and made of the same material, and the first initialization signal line 11 is arranged in a different layer from the first compensation signal line 21.

Illustratively, the orthographic projection of the first compensation signal line 21 onto the base substrate and the orthographic projection of the first initialization signal line 11 onto the base substrate have a first overlap area, the first compensation signal line 21 and the first initialization signal line 11 are coupled through a first via hole, and an orthographic projection of the first via hole onto the base substrate is located within the first overlap area.

Illustratively, the orthographic projection of the second compensation signal line 22 onto the base substrate and the orthographic projection of the second initialization signal line 12 onto the base substrate have a second overlap area, the second compensation signal line 22 and the second initialization signal line 12 are coupled by a second via hole, and the orthographic projection of the second via hole onto the base substrate being located within the second overlap area.

It needs to be stated that, in a reset phase, a first initialization signal is input into a sub-pixel, namely, all the storage capacitors Cst in a row of sub-pixels are charged using the first initialization signal, and the charging load is equal to the capacity value of the storage capacitor Cst×the number of sub-pixels in a row of sub-pixels. For medium-sized and large-sized display screens, for example, screens in laptop computers and vehicle-mounted displays, when there are a large number of horizontal rows of sub-pixels, the Loading at the moment when inputting the first initialization signal can reach more than 100 pF. Furthermore, if the control writing duration during which the first initialization signal is input is short, the initialization signal of one row of sub-pixels will be undercharged, thereby affecting the display effect.

The above-mentioned arrangement that the first compensation signal line 21 is coupled to the first initialization signal line 11 effectively reduces the resistance of the first initialization signal line 11 and reduces the voltage drop generated when the first initialization signal is transmitted on the first initialization signal line 11.

The above-mentioned arrangement that the second compensation signal line 22 is coupled to the second initialization signal line 12 effectively reduces the resistance of the second initialization signal line 12 and reduces the voltage drop generated when the second initialization signal is transmitted on the second initialization signal line 12.

The above-mentioned arrangement that the first compensation signal line 21 is coupled to the first initialization signal line 11, and/or the second compensation signal line 22 is coupled to the second initialization signal line 12 improves the problems such as a large loading during the transmission of a first initialization signal and/or a second initialization signal, and insufficient charging of a sub-pixel initialization signal located in the middle part of a row of sub-pixels, etc. The uniformity of the first initialization signal and/or the second initialization signal is effectively improved. The color cast at the low-gray-scale brightness is reduced, and the image quality at a low gray scale is improved. The product yield of the display substrate is effectively improved.

As shown in FIG. 1, FIG. 3, FIG. 4, FIG. 5 and FIG. 11, in some embodiments, the sub-pixels further include: a data line 23, at least part of the data line 23 extends in the second direction.

In the same sub-pixel, the orthographic projection of the gate electrode T3-*g* of the drive transistor T3 onto the base substrate is located between the orthographic projection of the data line 23 onto the base substrate and the orthographic projection of the first compensation signal line 21 onto the base substrate; and is located between the orthographic projection of the data line 23 onto the base substrate and the orthographic projection of the second compensation signal line 22 onto the base substrate. The first compensation signal line 21 and the second compensation signal line 22 are both provided in the same layer and made of the same material as the data line 23.

Illustratively, in the same sub-pixel, the orthographic projection of the first compensation signal line 21 onto the base substrate and the orthographic projection of the second compensation signal line 22 onto the base substrate are close to a first side of the orthographic projection of the gate electrode T3-*g* of the drive transistor T3 onto the base substrate.

Illustratively, the first compensation signal line 21 and the second compensation signal line 22 are arranged in the first direction.

Illustratively, in the same sub-pixel, the orthographic projection of the first compensation signal line 21 onto the base substrate is located between the orthographic projection of the second compensation signal line 22 onto the base substrate and the orthographic projection of the gate electrode T3-*g* of the drive transistor T3 onto the base substrate.

Illustratively, in the same sub-pixel, the orthographic projection of the second compensation signal line 22 onto the base substrate is located between the orthographic projection of the first compensation signal line 21 onto the base substrate and the orthographic projection of the gate electrode T3-*g* of the drive transistor T3 onto the base substrate.

In the above-mentioned arrangement, the data line 23 and the first compensation signal line 21 are respectively located at two opposite sides of the same sub-pixel, while the data line 23 and the second compensation signal line 22 are respectively located at two opposite sides of the same sub-pixel. This makes it possible to reduce the influence of the signal transmitted from the first compensation signal line 21 and the signal transmitted from the second compensation signal line 22 on the signal transmitted from the data line 23, which is advantageous in improving the stability of the operation of the display substrate.

In some embodiments, in the same sub-pixel, the orthographic projection of the first compensation signal line 21 onto the base substrate is close to a first side of the orthographic projection of the gate electrode T3-*g* of the drive transistor T3 onto the base substrate, and the orthographic projection of the second compensation signal line 22 onto the base substrate is close to a second side of the orthographic projection of the gate electrode T3-*g* of the drive transistor T3 onto the base substrate. The first side and the second side are opposite in the first direction.

In some embodiments, the sub-pixels further include: a data line, at least part of the data line extending in the second direction; in the same sub-pixel, the orthographic projection of the data line onto the base substrate is located between an orthographic projection of the gate electrode of the drive transistor onto the base substrate and the orthographic projection of the first compensation signal line onto the base substrate; and is located between the orthographic projection of the gate electrode of the drive transistor onto the base substrate and the orthographic projection of the second compensation signal line onto the base substrate. The first compensation signal line and the second compensation signal line are both arranged in the same layer and made of the same material as the data line.

In the above-mentioned arrangement manner, among two adjacent sub-pixels in the same row, the data line included in one sub-pixel is far away from the first compensation signal line and the second compensation signal line included in the other sub-pixel, so that the influence of the signal transmitted by the first compensation signal line 21 and the signal transmitted by the second compensation signal line 22 on the signal transmitted by the data lines 23 in the adjacent sub-pixels can be reduced, which is beneficial to improving the stability of the operation of the display substrate.

As shown in FIG. 1, FIG. 3, FIG. 4, FIG. 5, and FIG. 11, in some embodiments, the sub-pixel further includes: a data line 23, at least part of the data line 23 extends in the second direction, an orthographic projection of the data line 23 onto the base substrate is close to a second side of an orthographic projection of a gate electrode T3-*g* of the drive transistor T3 onto the base substrate, the first side and the second side being opposite in the first direction. The first compensation signal line 21 and the second compensation signal line 22 are both provided in the same layer and made of the same material as the data line 23.

Illustratively, a plurality of sub-pixels in the display substrate are distributed in an array, and the plurality of sub-pixels can be divided into a plurality of rows of sub-pixels and a plurality of columns of sub-pixels. Each row of sub-pixels includes a plurality of sub-pixels arranged in the first direction, and each column of sub-pixels includes a plurality of sub-pixels arranged in the second direction.

Illustratively, in the sub-pixels located in the same column, the data lines 23 are sequentially coupled to form an integral structure. The data line 23 is used for writing a data signal Data.

Illustratively, the display substrate includes an active layer, a first gate insulating layer, a first gate metal layer, a second gate insulating layer, a second gate metal layer, an interlayer insulating layer, a first source and drain metal layer, a first planar layer, a second source and drain metal layer, a second planar layer, an anode layer, a light-emitting functional layer, a cathode layer and an encapsulation layer, which are stacked in sequence in a direction away from the base substrate.

Illustratively, the second source and drain metal layer is used to form the first compensation signal line 21, the second compensation signal line 22, and the data line 23.

The above-mentioned layout method is not only beneficial for reducing the layout difficulty of the sub-pixels, but also beneficial for simplifying the manufacturing process flow of the display substrate and reducing the manufacturing cost.

In some embodiments, the plurality of sub-pixels are arranged in an array, sub-pixels located in the same row in the first direction are coupled with the first initialization signal line 11, sub-pixels located in the same column in the second direction are coupled with the first compensation signal line 21; and/or the second initialization signal lines 12 are coupled in sub-pixels of the same row in the first direction and the second compensation signal lines 22 are coupled in sub-pixels of the same column in the second direction.

Illustratively, in sub-pixels located in the same row in the first direction, the first initialization signal lines 11 are sequentially coupled to form an integral structure.

Illustratively, in sub-pixels located in the same column in the second direction, the first compensation signal lines 21 are sequentially coupled to form an integral structure.

Illustratively, in sub-pixels located in the same row in the first direction, the second initialization signal lines 12 are sequentially coupled to form an integral structure.

Illustratively, in sub-pixels located in the same column in the second direction, the second compensation signal lines 22 are sequentially coupled to form an integral structure.

The above-mentioned arrangement enables the first initialization signal lines 11 and the first compensation signal lines 21 in the display substrate to form a grid-like structure, effectively reducing the resistance of the first initialization signal lines 11, reducing the voltage drop during the transmission of the first initialization signal, improving the display uniformity of the display substrate, and effectively improving the display yield of the display substrate.

The above-mentioned arrangement enables the second initialization signal line 12 and the second compensation signal line 22 in the display substrate to form a grid-like structure, effectively reducing the resistance of the second initialization signal line 12, reducing the voltage drop during the transmission of the second initialization signal, improving the display uniformity of the display substrate, and effectively improving the display yield of the display substrate.

As shown in FIG. 1, FIG. 3, FIG. 4, FIG. 5, FIG. 11 and FIG. 12, in some embodiments, the display substrate includes a display area 40 and a peripheral area 41 surrounding the display area 40. The display substrate further includes:

- a first initialization signal bus 31, where the first initialization signal bus 31 is arranged in the peripheral area 41, at least part of the first initialization signal bus 31 extends in the second direction, and the first initialization signal line 11 is coupled to the first initialization signal bus 31; and/or,
- a second initialization signal bus 32, where the second initialization signal bus 32 is arranged in the peripheral area, at least part of the second initialization signal bus 32 extends in the second direction, the second initialization signal line 12 is coupled to the second initialization signal bus 32.

Illustratively, the first initialization signal bus 31 is proximate to a first side and a second side of the display area 40, and the first side and the second side are opposite in the first direction.

Illustratively, the first initialization signal bus 31 includes a portion close to the first side of the display area 40 and a portion close to the second side of the display area 40.

Illustratively, in the same row of sub-pixels in the first direction, the first initialization signal lines 11 are coupled in sequence, and are further coupled to the first initialization signal bus 31 at the first side and the second side of the display area 40.

Illustratively, the first initialization signal bus 31 is coupled to a driver chip in the display substrate.

The above-mentioned arrangement mode effectively reduces the resistance of the first initialization signal lines 11, reduces the voltage drop during the transmission of the first initialization signal, improves the display uniformity of the display substrate, and effectively improves the display yield of the display substrate.

Figure 13:
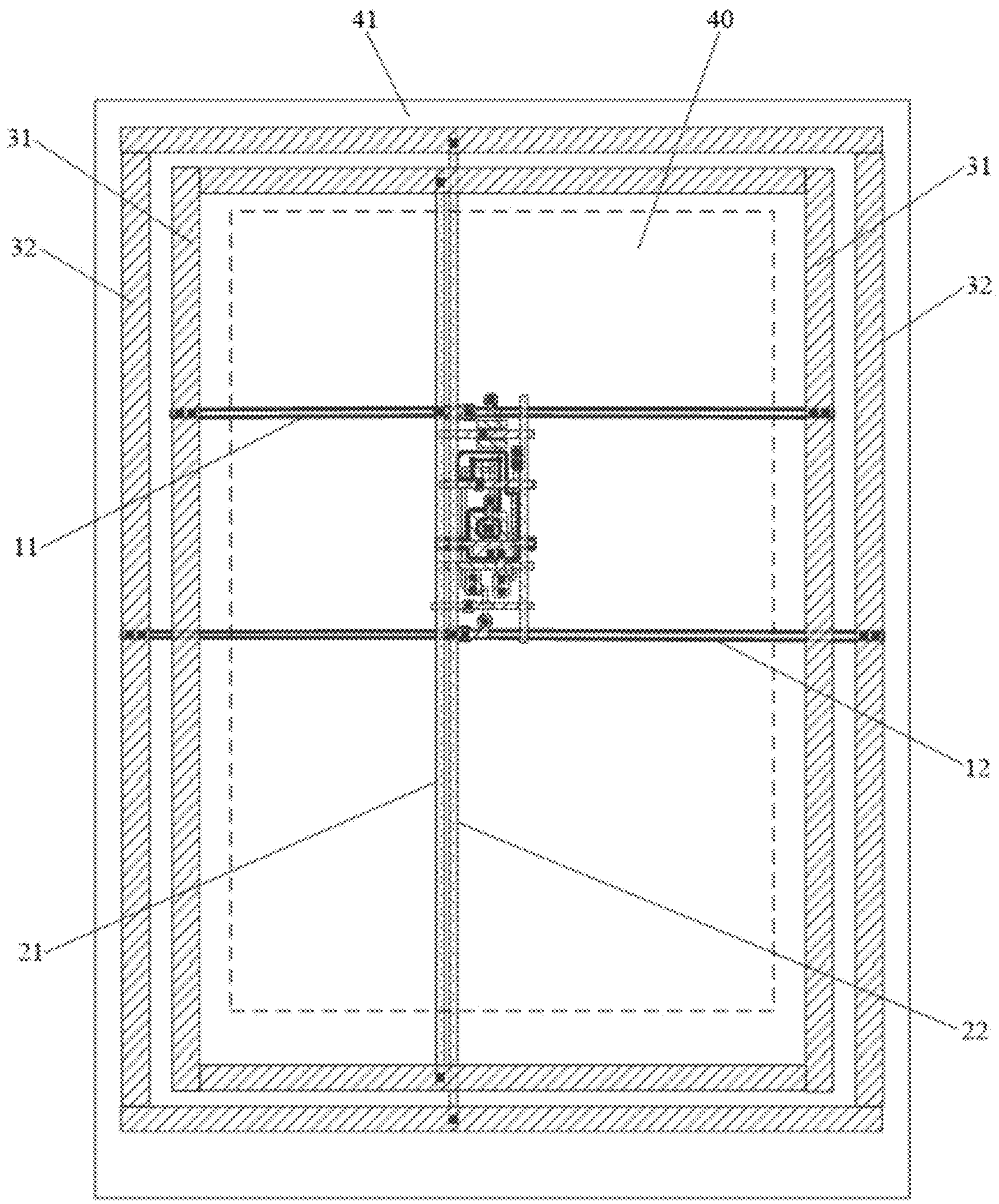
FIG. 13 is a second schematic diagram of a display substrate provided in an embodiment of the present disclosure.

As shown in FIG. 13, in some embodiments, the first initialization signal bus 31 surrounds the display area 40; the first compensation signal line 21 is coupled to the first initialization signal bus 31; and/or the second initialization signal bus 32 surrounds the display area 40; the second compensation signal line 22 is coupled to the second initialization signal bus 32.

Figure 12:
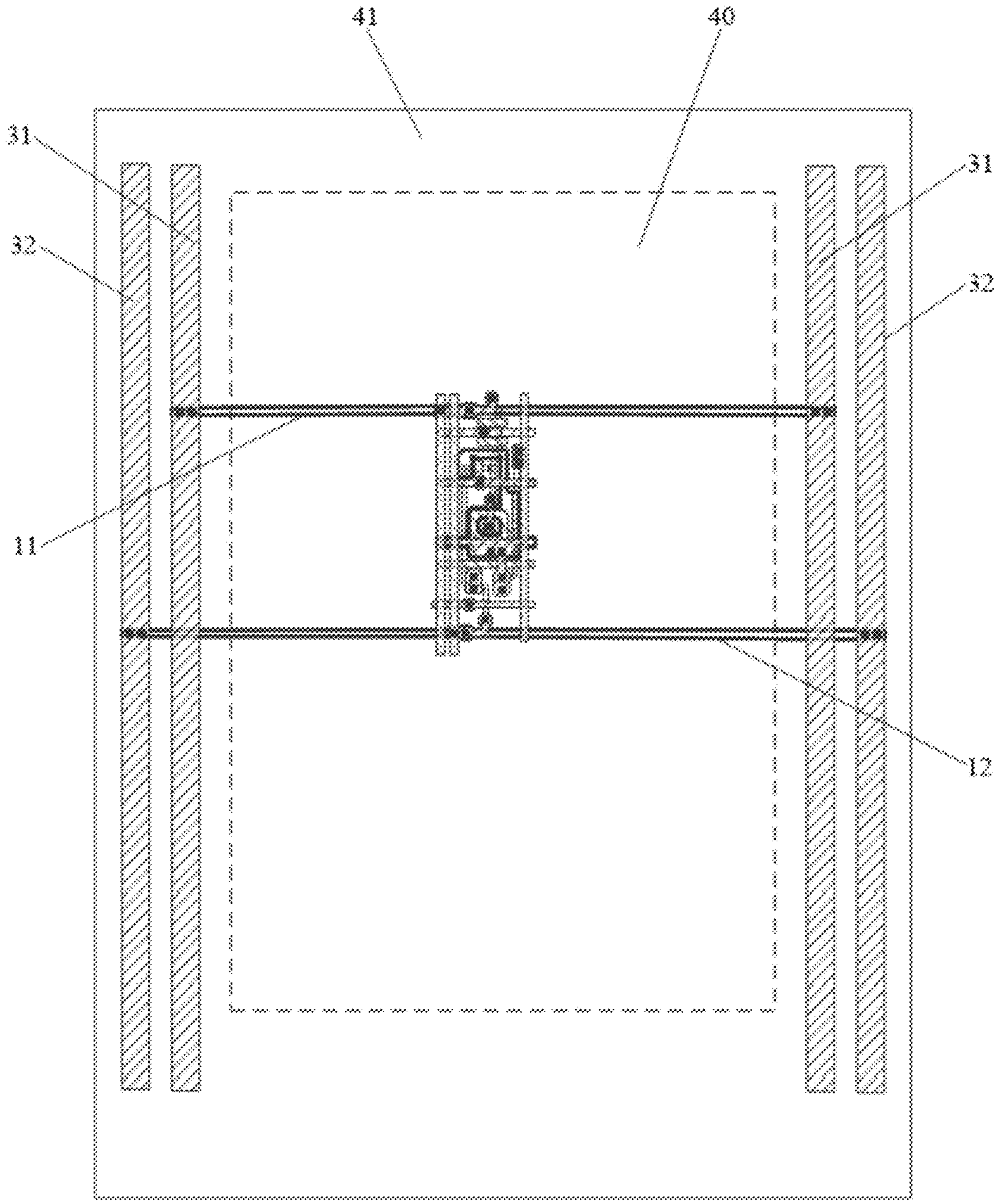
FIG. 12 is a first schematic diagram of a display substrate provided in an embodiment of the present disclosure.

It should be noted that the display area 40 in FIGS. 12 and 13 includes a plurality of sub-pixels distributed in an array, and FIGS. 12 and 13 show a sub-pixel driving circuit included in only one of the sub-pixels.

Illustratively, the first initialization signal bus 31 also includes a portion proximate to a third side of the display area 40 and a portion proximate to a fourth side of the display area 40, and the third side and the fourth side are opposite in the second direction.

Illustratively, in the same column of sub-pixels in the second direction, the first compensation signal line 21 are sequentially coupled, and further coupled to the first initialization signal buses 31 at the third and fourth sides of the display area 40.

The above-mentioned arrangement mode effectively reduces the resistance of the first initialization signal lines 11, reduces the voltage drop during the transmission of the first initialization signal, improves the display uniformity of the display substrate, and effectively improves the display yield of the display substrate.

In some embodiments, the plurality of sub-pixels are distributed in an array, and the second initialization signal lines 12 that are located in the same row of sub-pixels in the first direction are coupled to each other; the second compensation signal lines 22 that are located in the same column of sub-pixels in the second direction are coupled to each other.

Illustratively, in sub-pixels located in the same row in the first direction, the second initialization signal lines 12 are sequentially coupled to form an integral structure.

Illustratively, in sub-pixels located in the same column in the second direction, the second compensation signal lines 22 are sequentially coupled to form an integral structure.

The above-mentioned arrangement enables the second initialization signal lines 12 and the second compensation signal lines 22 in the display substrate to form a grid-like structure, effectively reducing the resistance of the second initialization signal lines 12, reducing the voltage drop during the transmission of the second initialization signal, improving the display uniformity of the display substrate, and effectively improving the display yield of the display substrate.

As shown in FIG. 1, FIG. 3, FIG. 4, FIG. 5, FIG. 11 and FIG. 12, in some embodiments, the display substrate includes a display area 40 and a peripheral area 41 surrounding the display area 40. The display substrate further includes: a second initialization signal bus 32. The second initialization signal bus 32 is provided in the peripheral area 41, at least part of the second initialization signal bus 32 extends in the second direction, the second initialization signal bus 32 is close to a first side and a second side of the display area 40, the first side and the second side are opposite in the first direction; the second initialization signal line 12 is coupled to the second initialization signal bus 32.

Illustratively, the second initialization signal bus 32 includes a portion proximate to a first side of the display area 40 and a portion proximate to a second side of the display area 40.

Illustratively, in the same row of sub-pixels in the first direction, the second initialization signal lines 12 are coupled in sequence, and further coupled to the second initialization signal bus 32 at a first side and a second side of the display area 40.

Illustratively, the second initialization signal bus 32 is coupled to a driver chip in the display substrate.

The above-mentioned arrangement mode effectively reduces the resistance of the second initialization signal lines 12, reduces the voltage drop during the transmission of the second initialization signal, improves the display uniformity of the display substrate, and effectively improves the display yield of the display substrate.

As shown in FIG. 13, in some embodiments, the second initialization signal bus 32 surrounds the display area 40; the second compensation signal line 22 is coupled to the second initialization signal bus 32.

Illustratively, the second initialization signal bus 32 also includes a portion proximate to a third side of the display area 40 and a portion proximate to a fourth side of the display area 40, the third and fourth sides being opposite in the second direction.

Illustratively, in the same column of sub-pixels in the second direction, the second compensation signal lines 22 are sequentially coupled, and further coupled to the second initialization signal bus 32 at the third and fourth sides of the display area 40.

Illustratively, the second initialization signal bus 32 and the first initialization signal bus 31 are nested. Illustratively, the second initialization signal bus 32 surrounds the first initialization signal bus 31; alternatively, the first initialization signal bus 31 surrounds the second initialization signal bus 32.

The above-mentioned arrangement mode effectively reduces the resistance of the second initialization signal line 12, reduces the voltage drop during the transmission of the second initialization signal, improves the display uniformity of the display substrate, and effectively improves the display yield of the display substrate.

As shown in FIGS. 1 to 6, in some embodiments, the sub-pixel further includes: a first reset signal line 33, at least part of which extends in the first direction; the first reset transistor T1 includes a first gate pattern T1-*g* and a first active pattern; the first gate pattern T1-*g* is coupled to the first reset signal line 33, the first gate pattern T1-*g* is in a U-shaped structure, and the opening of the U-shaped structure faces the data line 23; the orthographic projection of the first active pattern onto the base substrate at least partially overlaps the orthographic projection of the portions of the first gate pattern T1-*g* on both sides of the opening onto the base substrate, respectively.

Illustratively, the first reset signal line 33 is used to transmit a first reset signal Res1. The first reset signal line 33 and the first gate patterns T1-*g* are arranged in different layers. The orthographic projection of the first reset signal line 33 onto the base substrate and the orthographic projection of the first gate pattern T1-*g* onto the base substrate have a third overlap area, the first reset signal line 33 and the first gate pattern T1-*g* are coupled through a third via hole, the orthographic projection of the third via hole onto the base substrate is located within the third overlap area.

It should be noted that the small squares with cross lines in the figures represent via holes.

Illustratively, at least part of the first active pattern extends in the second direction. The orthographic projection of the first active pattern onto the base substrate at least partially overlaps with the orthographic projection of the portions of the first gate pattern T1-*g* that are located at both sides of the opening onto the base substrate, respectively, so that the first reset transistor T1 is formed as a double gate structure.

Illustratively, the orthographic projection of the first gate pattern T1-*g* onto the base substrate does not overlap the orthographic projection of the first initialization signal line 11 onto the base substrate. The orthographic projection of the first active pattern onto the base substrate partially overlaps the orthographic projection of the first initialization signal line 11 onto the base substrate.

The above-mentioned layout method is beneficial to reducing the layout difficulty of the display substrate, reducing the layout space occupied by each sub-pixel, and improving the resolution of the display substrate.

Figure 5:
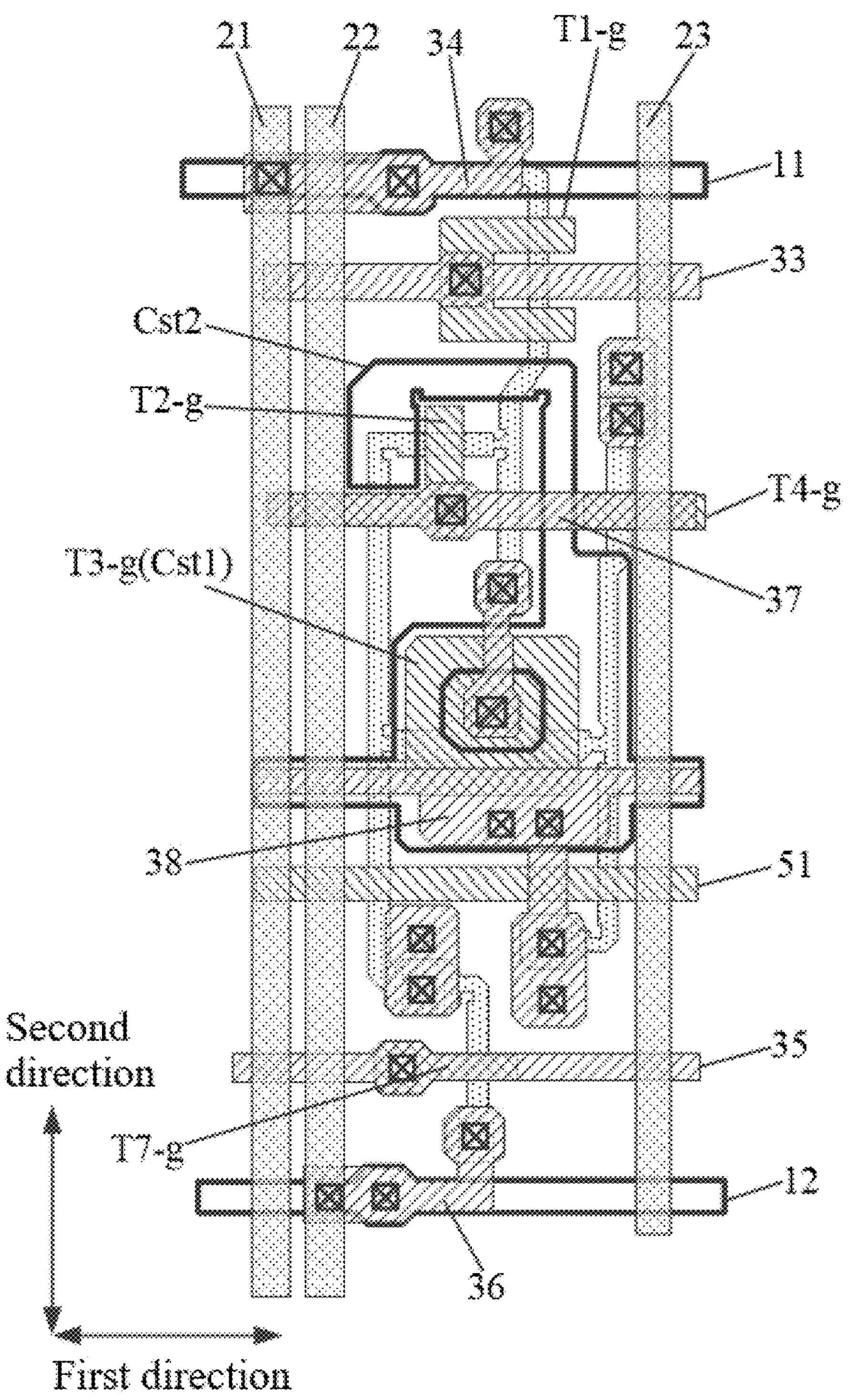
FIG. 5 is a schematic diagram of a fourth layout of sub-pixels provided in an embodiment of the present disclosure.
Figure 6:
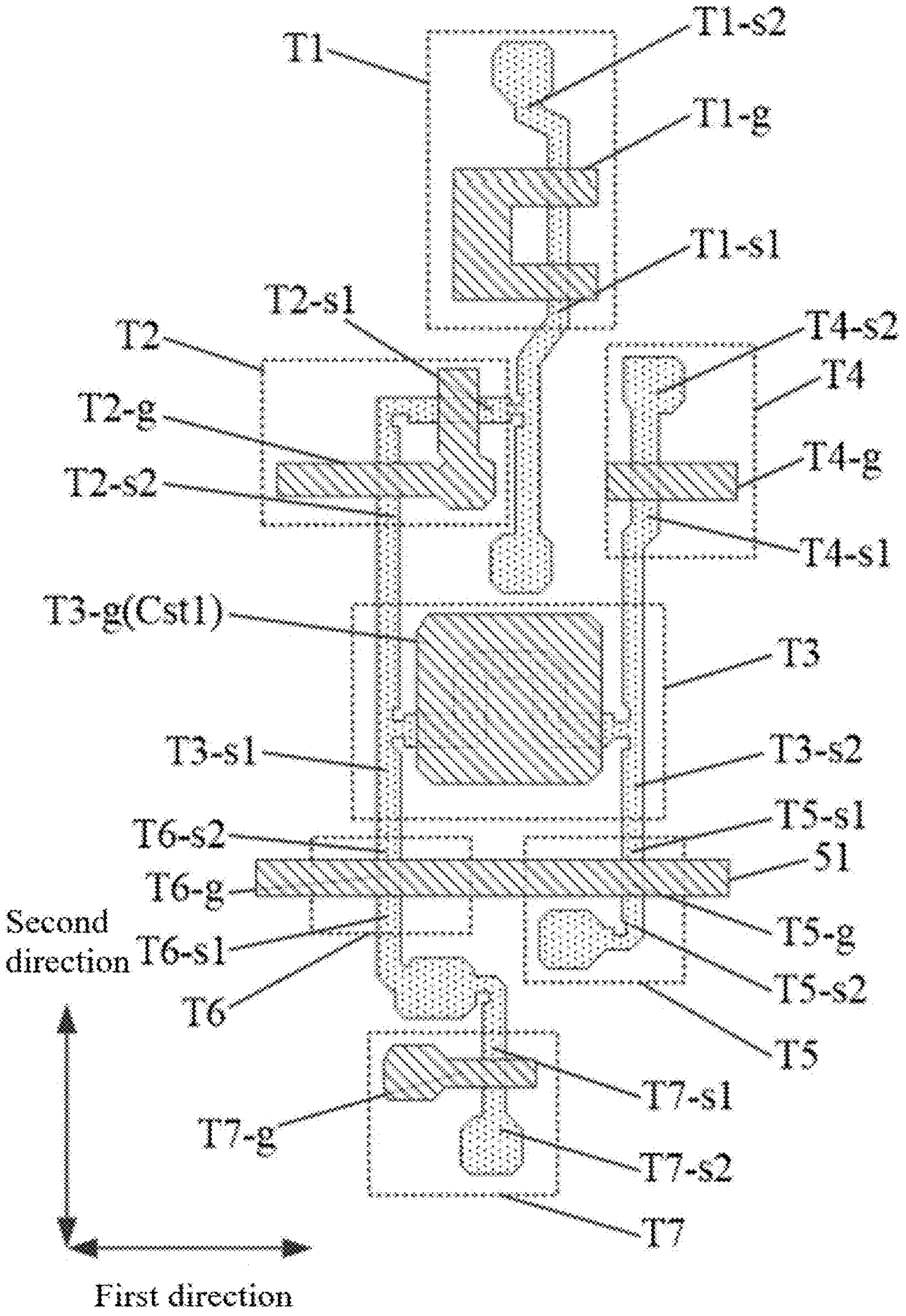
FIG. 6 is a layout diagram of an active layer and a first gate metal layer of FIG. 5.
Figure 10:
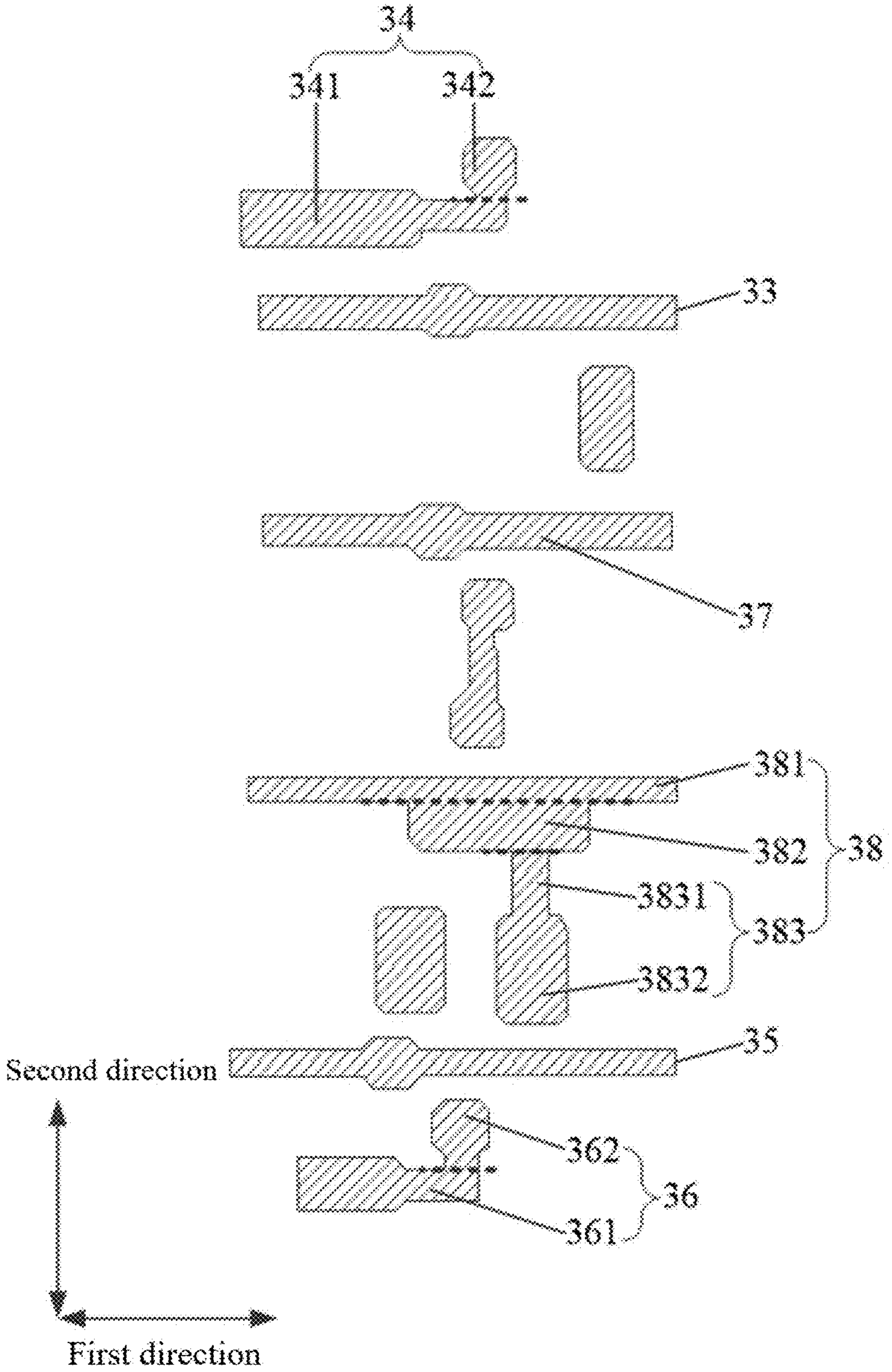
FIG. 10 is a layout diagram of a first source and drain metal layer of FIG. 5.
Figure 11:
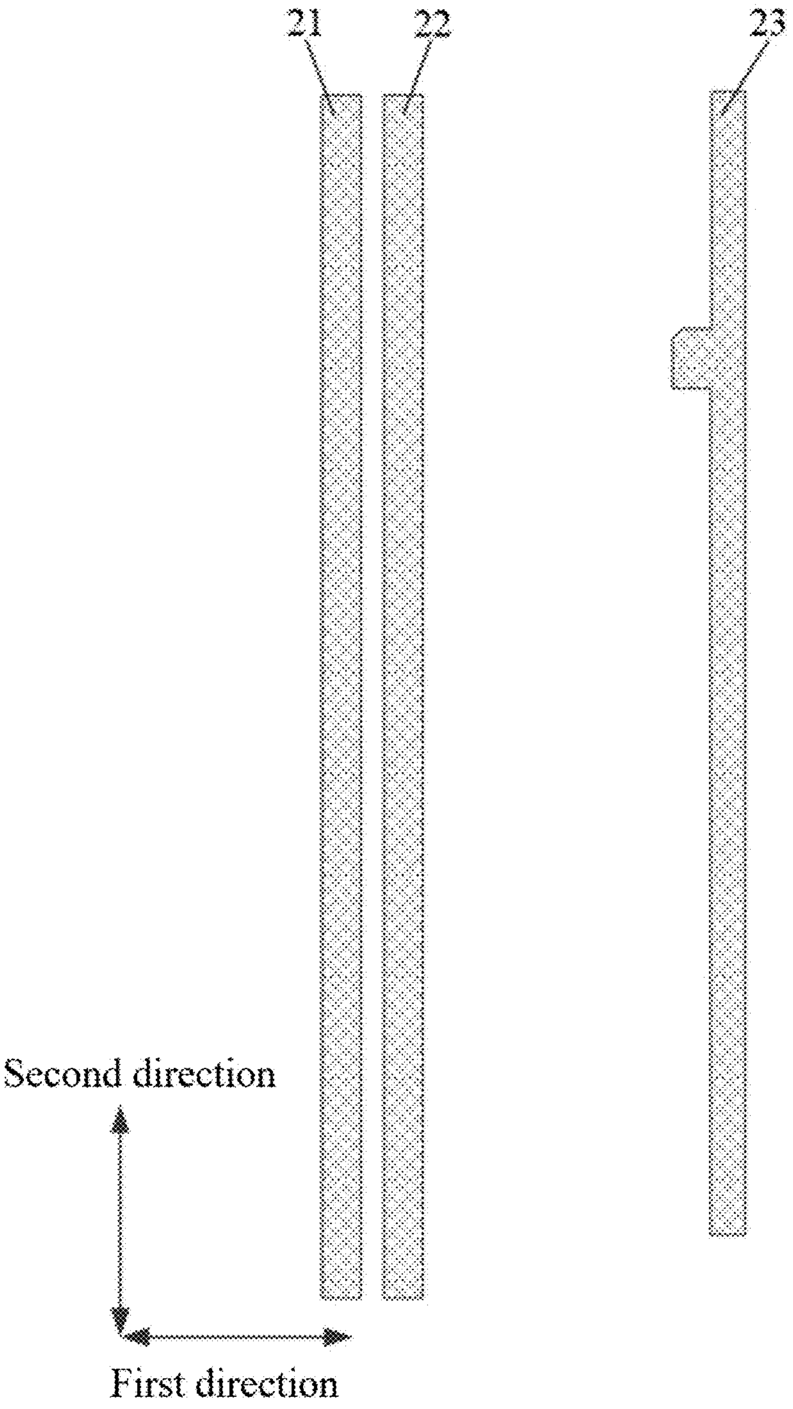
FIG. 11 is a layout diagram of a second source and drain metal layer of FIG. 5.

As shown in FIGS. 5 and 6, in some embodiments, the first active pattern includes a first electrode T1-*s*1 and a second electrode T1-*s*2 of the first reset transistor T1;

As shown in FIGS. 5 and 10, the sub-pixel further includes: a first conductive connecting part 34 (SD1), the first conductive connecting part 34 includes a first portion 341 and a second portion 342, the first portion 341 is coupled to the first initialization signal line 11 and the first compensation signal line 21, the second portion 342 is coupled to a second electrode T1-*s*2 of the first reset transistor T1.

Illustratively, each transistor in the sub-pixel includes first and second electrodes, one of which may serve as a source electrode and the other of which may serve as a drain electrode.

Illustratively, the first portion 341 extends in the first direction and the second portion 342 extends in the second direction.

Illustratively, the first portion 341 and the second portion 342 are formed as an integral structure.

Illustratively, the orthographic projection of the first portion 341 onto the base substrate overlaps the orthographic projection of the first initialization signal line 11 onto the base substrate, and the orthographic projection of the first portion 341 onto the base substrate overlaps the orthographic projection of the first compensation signal line 21 onto the base substrate. The first portion 341 is coupled to the first initialization signal line 11 and the first compensation signal line 21 through a via hole.

Illustratively, the orthographic projection of the second portion 342 onto the base substrate at least partially overlaps the orthographic projection of the second electrode T1-*s*2 of the first reset transistor T1 onto the base substrate. The second portion 342 is coupled to the second electrode T1-*s*2 of the first reset transistor T1 through a via hole.

The above-mentioned arrangement that the first conductive connecting part 34 is coupled to the first initialization signal line 11, the first compensation signal line 21 and the second electrode T1-*s*2 of the first reset transistor T1 not only ensures the electrical connection performance, but also effectively reduces the layout difficulty of the display substrate, which is beneficial to improving the resolution of the display substrate.

As shown in FIGS. 5 and 6, in some embodiments, the sub-pixel further includes: a second reset signal line 35, at least part of which extends in the first direction. The second reset transistor T7 includes a second gate pattern T7-*g* and a second active pattern; the second gate pattern T7-*g* is coupled to the second reset signal line 35, and at least part of the second gate pattern T7-*g* extends in the first direction; the second active pattern, the second gate pattern T7-*g*, and the second reset signal line 35 are sequentially stacked in a direction away from the base substrate.

Illustratively, the second reset signal line 35 is used to transmit a second reset signal Res2. The second reset signal line 35 and the second gate pattern T7-*g* are arranged in different layers. The orthographic projection of the second reset signal line 35 onto the base substrate and the orthographic projection of the second gate pattern T7-*g* onto the base substrate have a fourth overlap area, the second reset signal line 35 and the second gate pattern T7-*g* are coupled through a fourth via hole, and the orthographic projection of the fourth via hole onto the base substrate is located at the fourth overlap area.

Illustratively, the orthographic projection of the second gate pattern T7-*g* onto the base substrate is located within the orthographic projection of the second reset signal line 35 onto the base substrate.

Illustratively, the orthographic projection of the second gate pattern T7-*g* onto the base substrate does not overlap the orthographic projection of the second initialization signal line 12 onto the base substrate.

Illustratively, at least part of the second active pattern extends in the second direction. The second active pattern includes a first electrode T7-*s*1 and a second electrode T7-*s*2 of the second reset transistor T7.

As shown in FIG. 5, FIG. 6, FIG. 7, FIG. 9 and FIG. 10, illustratively, the orthographic projection of the second active pattern onto the base substrate does not overlap the orthographic projection of the second initialization signal line 12 onto the base substrate. The orthographic projection of the second active pattern onto the base substrate at least partially overlaps the orthographic projection of the second reset signal line 35 onto the base substrate.

The above-mentioned layout method is advantageous for reducing the layout difficulty of the display substrate, reducing the layout space occupied by each sub-pixel, and improving the resolution of the display substrate.

Figure 7:
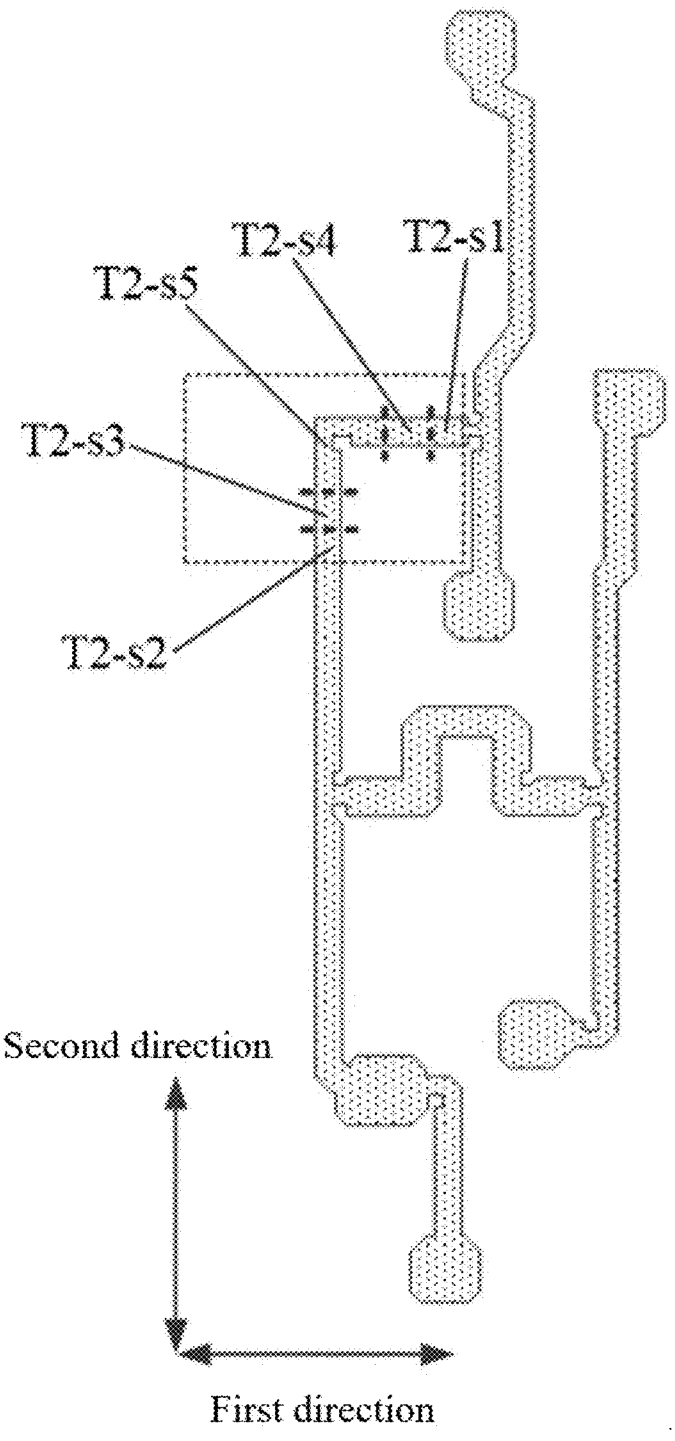
FIG. 7 is a layout diagram of the active layer of FIG. 5.

As shown in FIGS. 6 and 7, in some embodiments, the second active pattern includes a first electrode T7-*s*1 and a second electrode T7-*s*2 of the second reset transistor T7. As shown in FIGS. 5 and 10, the sub-pixel further includes: a second conductive connecting part 36, the second conductive connecting part 36 includes a third portion 361 and a fourth portion 362, the third portion 361 is coupled to the second initialization signal line 12 and the second compensation signal line 22, the fourth portion 362 is coupled to a second electrode T7-*s*2 of the second reset transistor T7.

Illustratively, the third portion 361 extends in the first direction and the fourth portion 362 extends in the second direction.

Illustratively, the third portion 361 and the fourth portion 362 are formed as an integral structure.

Illustratively, the orthographic projection of the third portion 361 onto the base substrate overlaps the orthographic projection of the second initialization signal line 12 onto the base substrate, and the orthographic projection of the third portion 361 onto the base substrate overlaps the orthographic projection of the second compensation signal line 22 onto the base substrate. The third portion 361 is coupled to the second initialization signal line 12 and the second compensation signal line 22 through via holes.

Illustratively, the orthographic projection of the fourth portion 362 onto the base substrate at least partially overlaps the orthographic projection of the second electrode T7-*s*2 of the second reset transistor T7 onto the base substrate. The fourth portion 362 is coupled to the second electrode T7-*s*2 of the second reset transistor T7 by a via hole.

The above-mentioned arrangement that the second conductive connecting part 36 is respectively coupled to the second initialization signal line 12, the second compensation signal line 22 and the second electrode T7-*s*2 of the second reset transistor T7 not only ensures the electrical connection performance, but also effectively reduces the layout difficulty of the display substrate, which is beneficial to improving the resolution of the display substrate.

As shown in FIGS. 1 to 6 and FIG. 8, in some embodiments, the sub-pixel further includes: a gate line 37, at least part of the gate line 37 extends in the first direction. The sub-pixel driving circuit further includes:

- a compensation transistor T2 including a third gate pattern T2-*g* and a third active pattern; the third gate pattern T2-*g* is coupled to the gate line 37, the third gate pattern T2-*g* includes a fifth portion T2-*g*1 and a sixth portion T2-*g*2, the sixth portion T2-*g*2 extends in the first direction, the fifth portion T2-*g*1 extends in the second direction, the orthographic projection of the third active pattern onto the base substrate at least partially overlaps the orthographic projection of the sixth portion T2-*g*2 onto the base substrate and the orthographic projection of the fifth portion T2-*g*1 onto the base substrate respectively;
- a data write transistor T4, the data write transistor T4 including a fourth gate pattern T4-*g* and a fourth active pattern; the fourth gate pattern T4-*g* is coupled to the gate line 37, the fourth gate pattern T4-*g* extends in the first direction, and the fourth active pattern is coupled to the data line 23 and the second electrode T3-*s*2 of the drive transistor T3, respectively.

Illustratively, the gate line 37 is used to transmit a gate electrode scanning signal Gate.

Illustratively, the third gate pattern T2-*g* includes a sixth portion T2-*g*2 and a fifth portion T2-*g*1 formed as an integral structure.

Illustratively, the orthographic projection of the third gate pattern T2-*g* onto the base substrate and the orthographic projection of the gate line 37 onto the base substrate have an overlap area, and the third gate line pattern T2-*g* and the gate line 37 are coupled by a via hole, the orthographic projection of the via hole onto the base substrate being at the overlap area.

Illustratively, the third active pattern can form a first electrode T2-*s*1 and a second electrode T2-*s*2 of the compensation transistor T2, the first electrode T2-*s*1 of the compensation transistor T2 is coupled to the gate T3-*g* of the drive transistor T3, and the second electrode T2-*s*2 of the compensation transistor T2 is coupled to the first electrode T3-*s*1 of the drive transistor T3.

Illustratively, the orthographic projection of the fourth gate pattern T4-*g* onto the base substrate and the orthographic projection of the gate line 37 onto the base substrate have an overlap area, and the fourth gate line 37 pattern and the gate line 37 are coupled by a via hole, the orthographic projection of the via hole onto the base substrate falls within the overlap area.

Illustratively, the fourth active pattern can form a first electrode T4-*s*1 and a second electrode T4-*s*2 of the data write transistor T4, the first electrode T4-*s*1 of the data write transistor T4 is coupled to the second electrode T3-*s*2 of the drive transistor T3, and the second electrode T4-*s*2 of the data write transistor T4 is coupled to the data line 23.

The above-mentioned arrangement provides that the sub-pixel driving circuit further includes the data write transistor T4 and the compensation transistor T2, and a data signal can be written to the second electrode T3-*s*2 of the drive transistor T3 via the data write transistor T4, and a threshold voltage of the drive transistor T3 can be compensated via the compensation transistor T2.

Figure 8:
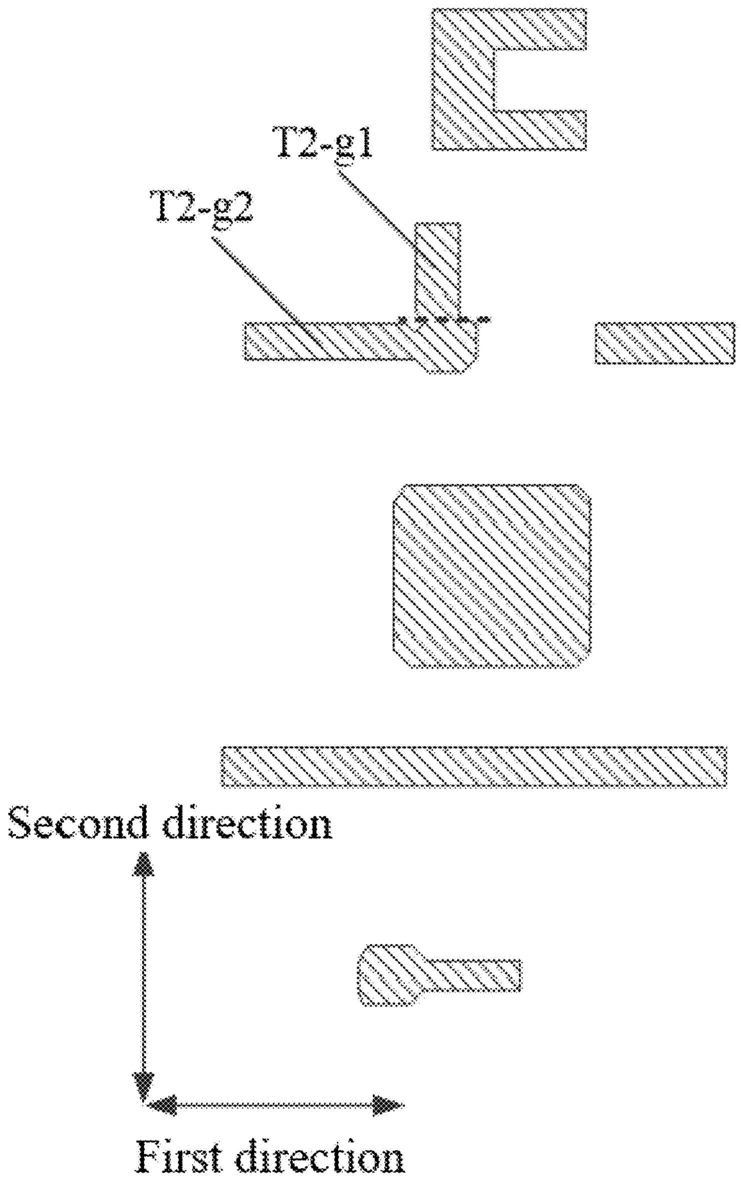
FIG. 8 is a layout diagram of the first gate metal layer of FIG. 5.

As shown in FIGS. 6 to 8, in some embodiments, the third active pattern includes a first sub-pattern T2-*s*3, a second sub-pattern T2-*s*4 and a third sub-pattern T2-*s*5; the orthographic projection of the first sub-pattern T2-*s*3 onto the base substrate at least partially overlaps the orthographic projection of the sixth portion T2-*g*2 onto the base substrate; the orthographic projection of the second sub-pattern T2-*s*4 onto the base substrate at least partially overlaps the orthographic projection of the fifth part T2-*g*1 onto the base substrate; the third sub-graph T2-*s*5 is located between the first sub-graph T2-*s*3 and the second sub-graph T2-*s*4, and is coupled to the first sub-graph T2-*s*3 and the second sub-graph T2-*s*4.

As shown in FIG. 5, the sub-pixel further includes: a power supply line 38, which includes a portion extending in the first direction.

As shown in FIGS. 5-9, the sub-pixel driving circuit further includes a storage capacitor Cst, the storage capacitor Cst includes a first plate Cst1 and a second plate Cst2 arranged opposite to each other, the first plate Cst1 is located between the second plate Cst2 and the base substrate, the first plate Cst1 is coupled to a gate electrode T3-*g* of the drive transistor T3, the second plate Cst2 is coupled to the power supply line 38, an orthographic projection of the second plate Cst2 onto the base substrate at least partially overlaps with an orthographic projection of the third sub-pattern T2-*s*5 onto the base substrate.

Illustratively, the first sub-pattern T2-*s*3, the second sub-pattern T2-*s*4, and the third sub-pattern T2-*s*5 are formed as an integral structure.

Illustratively, the portion of the first sub-pattern T2-*s*3 overlapping the sixth portion T2-*g*2 includes a semiconductor portion, the portion of the second sub-pattern T2-*s*4 overlapping the fifth portion T2-*g*1 includes a semiconductor portion, and the third sub-pattern T2-*s*5 includes a conductor portion.

Illustratively, the power supply line 38 is configured to transmit a positive power signal VDD.

Illustratively, the display substrate further includes a cathode for transmitting a negative power supply signal VSS.

By way of example, the sub-pixel driving circuit further includes a storage capacitor Cst, the storage capacitor Cst includes a first plate Cst1 and a second plate Cst2 arranged opposite to each other, and a gate electrode T3-*g* of the drive transistor T3 is reused as the first plate Cst1.

Illustratively, the orthographic projection of the first plate Cst1 onto the base substrate at least partially overlaps the orthographic projection of the power supply line 38 onto the base substrate.

Illustratively, the orthographic projection of the second plate Cst2 onto the base substrate partially overlaps the orthographic projection of the gate line 37 onto the base substrate. The orthographic projection of the second plate Cst2 onto the base substrate does not overlap the orthographic projection of the data line 23 onto the base substrate. The orthographic projection of the second plate Cst2 onto the base substrate does not overlap the orthographic projection of the light-emitting control signal line 51 onto the base substrate.

Illustratively, the light-emitting control signal line 51 is used to provide a light-emitting control signal EM.

The above-mentioned second plate Cst2 is arranged to be coupled to the power supply line 38, so that a positive power supply signal having a stable potential is transmitted on the second plate Cst2, and by arranging the orthographic projection of the second plate Cst2 onto the base substrate to at least partially overlap the orthographic projection of the third sub-pattern T2-*s*5 onto the base substrate, the interference of other signals at the periphery on the signal transmitted on the third sub-pattern T2-*s*5 is effectively shielded, thereby well ensuring the stability of the operation of the compensation transistor T2.

As shown in FIGS. 5 to 9, in some embodiments, the sub-pixel driving circuit is arranged to further include:

- a compensation transistor T2 including a third active pattern;
- a storage capacitor Cst, where the storage capacitor Cst includes a first plate Cst1 and a second plate Cst2 which are oppositely arranged, the second plate Cst2 includes a plate body Cst21 and a plate shielding part Cst22, an orthographic projection of the plate body Cst21 onto the base substrate at least partially overlaps with an orthographic projection of the first plate Cst1 onto the base substrate, and an orthographic projection of the plate shielding part Cst22 onto the base substrate at least partially overlaps with an orthographic projection of the third active pattern onto the base substrate;
- the orthographic projection of the plate shielding part Cst22 onto the base substrate does not overlap the orthographic projection of the first compensation signal line 21 onto the base substrate; and/or, the orthographic projection of the plate shielding part Cst22 onto the base substrate does not overlap the orthographic projection of the second compensation signal line 22 onto the base substrate.

The above-mentioned arrangement mode can effectively avoid the parasitic capacitance between the second plate Cst2 and the first compensation signal line 21 and the second compensation signal line 22, which is beneficial to improve the operating performance of the sub-pixel driving circuit.

In some embodiments, in the same sub-pixel, the orthographic projection of the first compensation signal line onto the base substrate is located between the orthographic projection of the plate shielding part Cst22 onto the base substrate and the orthographic projection of the second compensation signal line onto the base substrate.

Since the electric potential of the signal transmitted by the first compensation signal line is close to the electric potential of the signal on the second plate Cst2, the above-mentioned arrangement is beneficial to reduce the peripheral signal interference to the second plate Cst2.

As shown in FIG. 10, in some embodiments, the sub-pixel further includes: a power supply line 38; the power supply line 38 includes a first power supply pattern 381, a second power supply pattern 382 and a third power supply pattern 383; the first power supply pattern 381 and the second power supply pattern 382 both extend in the first direction, and the third power supply pattern 383 extends in the second direction; the second power supply pattern 382 is respectively coupled with the first power supply pattern 381 and the third power supply pattern 383; the second power supply pattern 382 is coupled to the second plate Cst2.

Figure 14:
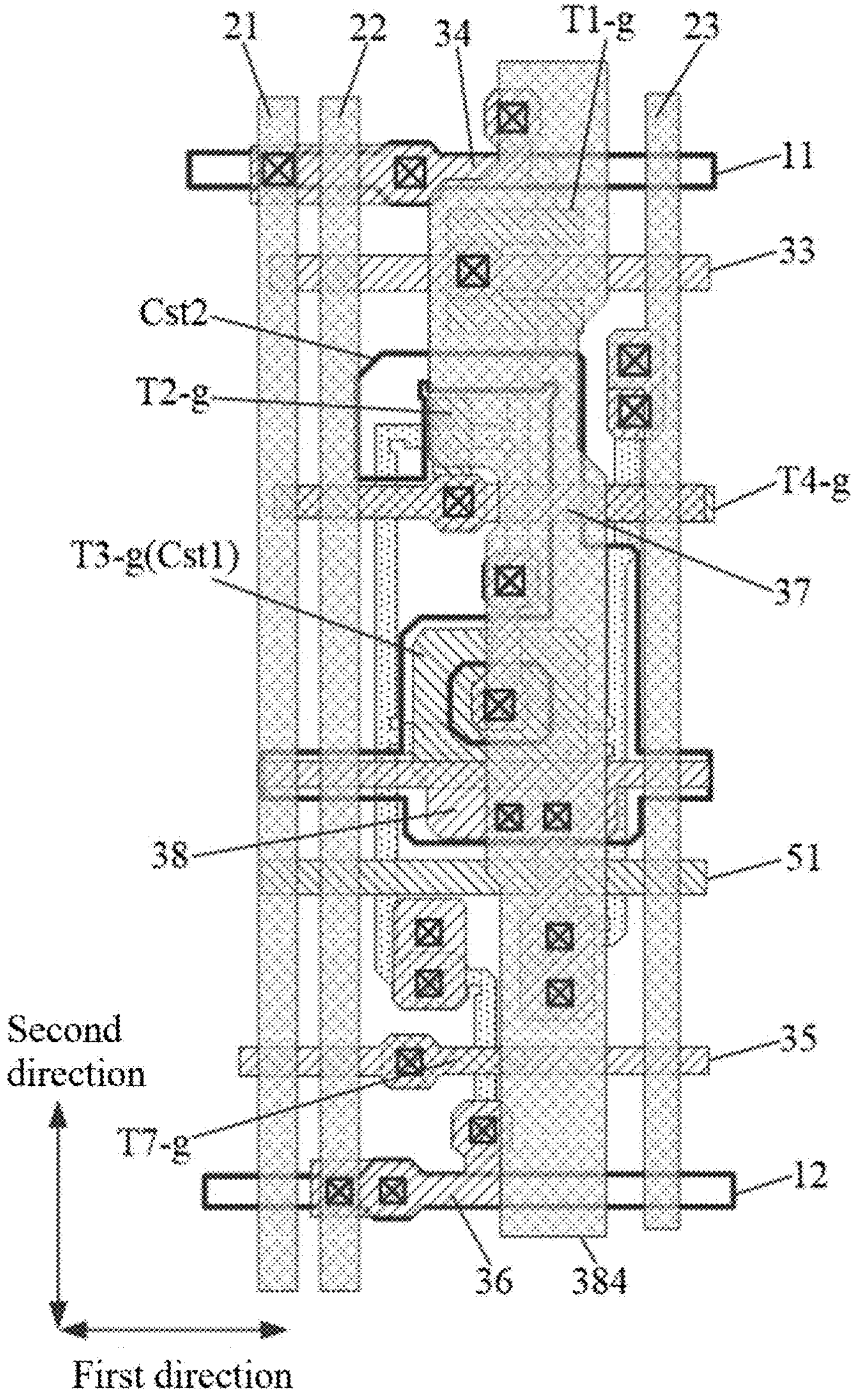
FIG. 14 is a schematic diagram of a fifth layout of sub-pixels provided in an embodiment of the present disclosure.
Figure 15:
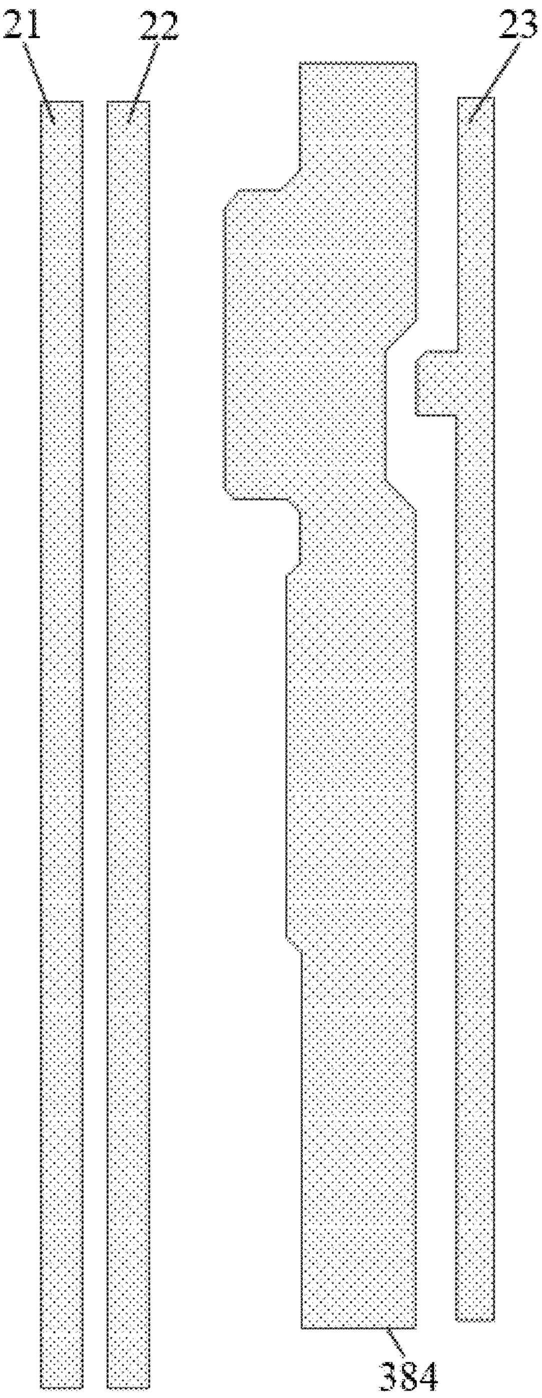
FIG. 15 is a layout diagram of the second source and drain metal layer of FIG. 14.

As shown in FIG. 14 and FIG. 15, the power supply line 38 further illustratively includes a fourth power supply pattern 384 coupled to the second power supply pattern 382.

Illustratively, the first power supply pattern 381, the second power supply pattern 382, and the third power supply pattern 383 are formed as an integral structure.

Illustratively, in the second direction, the width of the first power supply pattern 381 is less than the width of the second power supply pattern 382, which is less than the width of the third power supply pattern 383.

Illustratively, the orthographic projection of the first power supply pattern 381 onto the base substrate overlaps, at least in part, the orthographic projection of the second plate Cst2 onto the base substrate.

Illustratively, the orthographic projection of the first power supply pattern 381 onto the base substrate partially overlaps the orthographic projection of the first electrode T3-*s*1 of the drive transistor T3 onto the base substrate. The orthographic projection of the first power supply pattern 381 onto the base substrate overlaps with the orthographic projection of the second electrode T3-*s*2 of the drive transistor T3 onto the base substrate. The orthographic projection of the first power supply pattern 381 onto the base substrate partially overlaps the orthographic projection of the data line 23 onto the base substrate.

Illustratively, the orthographic projection of the second power supply pattern 382 onto the base substrate has an overlap area with the orthographic projection of the second plate Cst2 onto the base substrate, the second power supply pattern 382 being coupled to the second plate Cst2 through a via hole, the orthographic projection of the via hole onto the base substrate being at the overlap area.

Illustratively, the orthographic projection of the second power supply pattern 382 onto the base substrate does not overlap the orthographic projection of the first electrode T3-*s*1 of the drive transistor T3 onto the base substrate. The orthographic projection of the second power supply pattern 382 onto the base substrate at least partially overlaps the orthographic projection of the second electrode T3-*s*2 of the drive transistor T3 onto the base substrate.

Illustratively, the orthographic projection of the third power supply pattern 383 onto the base substrate overlaps, at least in part, the orthographic projection of the light-emitting control signal line 51 onto the base substrate.

Illustratively, the orthographic projection of the third power supply pattern 383 onto the base substrate does not overlap, or at least partially overlaps, the orthographic projection of the second plate Cst2 onto the base substrate.

Illustratively, the orthographic projection of the third power supply pattern 383 onto the base substrate and the orthographic projection of the second electrode T5-*s*2 of the power supply control transistor T5 onto the base substrate have an overlap area, and the third power supply pattern 383 and the second electrode T5-*s*2 of the power supply control transistor T5 are coupled through a via hole, the orthographic projection of the via hole onto the base substrate being at the overlap area.

The above arrangement of the power supply line 38 including the first power supply pattern 381, the second power supply pattern 382, and the third power supply pattern 383 is advantageous in reducing the layout difficulty of the power source line 38.

As shown in FIG. 5 and FIG. 10, in some embodiments, the sub-pixels further include: a light-emitting control signal line 51 including at least a portion extending in the first direction; the third power supply pattern 383 includes a first power supply sub-pattern 3831 and a second power supply sub-pattern 3832, and the width of the first power supply sub-pattern 3831 in the first direction is less than the width of the second power supply sub-pattern 3832; the orthographic projection of the first power supply sub-pattern 3831 onto the base substrate overlaps at least partially with the orthographic projection of the light-emitting control signal line 51 onto the base substrate.

The above-mentioned arrangement is advantageous in that the overlapping area between the power supply line 38 and the light-emitting control signal line 51 is reduced, the parasitic capacitance generated between the power supply line 38 and the light-emitting control signal line 51 is reduced, and the operational stability of the sub-pixel driving circuit can be effectively improved.

Figure 9:
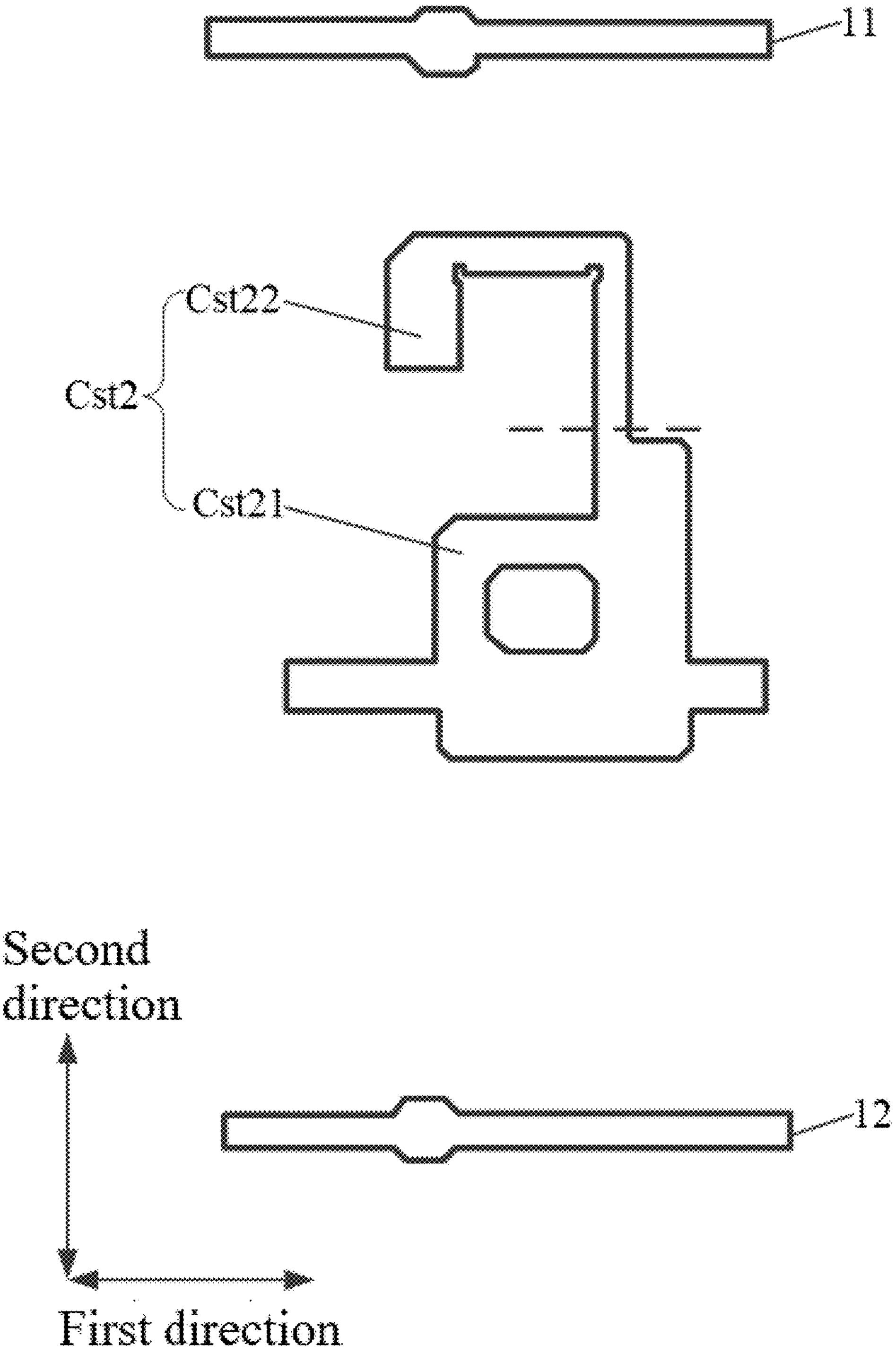
FIG. 9 is a layout diagram of a second gate metal layer of FIG. 5.

As shown in FIGS. 5, 9, and 10, in some embodiments, the orthographic projection of the second power supply pattern 382 onto the base substrate is arranged within the orthographic projection of the plate body Cst21 onto the base substrate.

The above-mentioned arrangement is advantageous for improving the flatness of the second power supply pattern 382, and can well improve the flatness of the anode layer in the sub-pixel.

As shown in FIGS. 1 to 6, in some embodiments, the sub-pixel further includes: a light-emitting control signal line 51, at least part of the light-emitting control signal line 51 extending in the first direction, an orthographic projection of the light-emitting control signal line 51 onto the base substrate at least partially overlapping an orthographic projection of the third power supply pattern 383 onto the base substrate. The sub-pixel driving circuit further includes:

- a power supply control transistor T5, where a gate electrode T5-*g* of the power supply control transistor T5 is coupled to the light-emitting control signal line 51, a first electrode T5-*s*1 of the power supply control transistor T5 is coupled to a second electrode of the drive transistor T3, and a second electrode T5-*s*2 of the power supply control transistor T5 is coupled to the third power supply pattern 383; and
- a light-emitting control transistor T6, where a gate electrode T6-*g* of the light-emitting control transistor T6 is coupled to the light-emitting control signal line 51, a first electrode T6-*s*1 of the light-emitting control transistor T6 is coupled to the light-emitting element EL, and a second electrode T6-*s*2 of the light-emitting control transistor T6 is coupled to a first electrode T3-*s*1 of the drive transistor T3.

Illustratively, the light-emitting control signal line 51 serves to transmit a light-emitting control signal EM.

Illustratively, the gate electrode T5-*g* of the power supply control transistor T5 is formed as an integral structure with the light-emitting control signal line 51.

Illustratively, the gate electrode T6-*g* of the light-emitting control transistor T6 and the light-emitting control signal line 51 are formed as an integral structure.

Illustratively, the first electrode T6-*s*1 of the light-emitting control transistor T6 and the first electrode T7-*s*1 of the second reset transistor T7 are formed as an integral structure.

In some embodiments, the display substrate further includes a first source and drain metal layer; the first reset signal line 33, the second reset signal line 35, a gate line 37, a power supply line 38, the first conductive connecting part 34 and the second conductive connecting part 36 are all arranged in the same layer and made of the same material as the first source and drain metal layer.

Illustratively, the first source and drain metal layer is used to form the first initialization signal bus 31 and the second initialization signal bus 32.

Illustratively, the orthographic projection of the first initialization signal line 11 onto the base substrate, the orthographic projection of the first reset signal line 33 onto the base substrate, the orthographic projection of the gate line 37 onto the base substrate, the orthographic projection of the light-emitting control signal line 51 onto the base substrate, the orthographic projection of the second reset signal line 35 onto the base substrate, and the orthographic projection of the second initialization signal line 12 onto the base substrate are sequentially arranged in the second direction.

Illustratively, the gate electrode of each of the above-mentioned transistors and the light-emitting control signal line 51 are each made of a first gate metal layer.

Illustratively, the second plate Cst2, the first initialization signal line 11 and the second initialization signal line 12 are made of a second gate metal layer.

Note that the N1 node is also shown in FIG. 1.

The above-mentioned arrangement is beneficial to simplify the manufacturing process of the display substrate and reduce the manufacturing cost of the display substrate. At the same time, the resistance of the first reset signal line 33, the second reset signal line 35, the gate line 37, the power supply line 38, the first conductive connecting part 34 and the second conductive connecting part 36 is advantageously reduced, and the stability of the operation of the sub-pixel driving circuit is improved.

In some embodiments, the first reset signal line 33 and the first gate metal layer are arranged in the same layer and made of the same material.

In some embodiments, the first compensation signal line 21 and the second compensation signal line 22 are both arranged in a same layer and made of a same material as the first source and drain metal layer. A conductive portion of the sub-pixel overlapping with the first compensation signal line 21 and the second compensation signal line 22 in the direction perpendicular to the base substrate is made of another film layer to avoid a short circuit with the first compensation signal line 21 and the second compensation signal line 22.

Embodiments of the present disclosure also provide a display device including the display substrate provided by the above embodiments.

In the display substrate provided in the above-mentioned embodiments, the gate electrode T3-*g* of the drive transistor T3 is reset using the first initialization signal provided by the first initialization signal line 11, and the light-emitting element EL is reset using the second initialization signal provided by the second initialization signal line 12, so that the first initialization signal for resetting the gate electrode T3-*g* of the drive transistor T3 and the second initialization signal for resetting the light-emitting element EL are independent from each other, and independent control can be achieved, and may have different voltage values. Thus, while ensuring the black-state luminance of the light-emitting element EL at the time of low-gray-scale display, it is possible to avoid increasing the leakage of the gate electrode T3-*g* of the drive transistor T3, thereby ensuring the white-state luminance of the light-emitting element EL at the time of high-gray-scale display.

Therefore, when the display device according to the embodiments of the present disclosure includes the above-mentioned display substrate, it is possible to improve the defects such as the afterimage and the response time of the first frame of the display device, and it is also possible to improve the mura defect occurring at the time of low-gray-scale display, thereby ensuring the uniformity of the brightness of the picture of the display device at the time of the high-gray-scale display and the low-gray-scale display.

It is to be noted that the display device may be: any product or component with a display function, such as a television, a display, a digital photo frame, a mobile phone, a tablet computer, and among others. The display device further includes a flexible circuit board, a printed circuit board and a back panel.

It is to be noted that the "same layer" in the embodiments of the present disclosure may refer to a film layer on the same structural layer. Or, for example, the film layer in the same layer may be a layer structure formed by forming a film layer for forming a specific pattern using the same film forming process and then patterning the film layer by one patterning process using the same mask plate. Depending on the particular pattern, a single patterning process may include multiple exposure, development, or etching processes, and the particular pattern in the resulting layer structure may or may not be continuous. The particular patterns may also be at different heights or have different thicknesses.

In the various method embodiments of the present disclosure, the serial number of each step cannot be used to define the order of each step, and for a person of ordinary skill in the art, without involving any inventive effort, changes in the order of each step are also within the scope of the present disclosure.

It should be noted that the various embodiments described herein are described in a progressive manner with reference to the same or similar parts throughout the various embodiments, with each embodiment focusing on differences from the other embodiments. In particular, the embodiments are described more simply because they are approximately similar to the product embodiments, with reference to the partial description of the product embodiments.

Unless defined otherwise, technical or scientific terms used in the present disclosure shall have the ordinary meaning as understood by one of ordinary skill in the art to which this disclosure belongs. Such terms as "first", "second" used in the present disclosure does not denote any order, quantity, or importance, but rather is used to distinguish one element from another. Such terms as "including" or "comprises" means that the presence of an element or item preceding the word covers the presence of the element or item listed after the word and equivalents thereof, but does not exclude other elements or items. Such terms as "connected" or "connected" are not limited to physical or mechanical connections, but may include electrical connections, whether direct or indirect. Such terms as "upper", "lower", "left", "right" are used only to indicate relative positional relationships that may change accordingly when the absolute position of the object being described changes.

It should be understood that when an element such as a layer, film, region, or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

The above are only specific embodiments of the present disclosure, but the protection scope of the present disclosure is not limited thereto. Anyone skilled in the art can easily think of changes or substitutions within the technical scope disclosed in the present disclosure, which shall fall within the protection scope of the present disclosure. Therefore, the protection scope of the present disclosure should be subjected to the protection scope of the claims.

What is claimed is:

1. A display substrate, comprising: a base substrate and a plurality of sub-pixels onto the base substrate, wherein the sub-pixel comprises:

a first initialization signal line and a second initialization signal line, wherein a potential of a first initialization signal transmitted by the first initialization signal line is different from a potential of a second initialization signal transmitted by the second initialization signal line; and a sub-pixel driving circuit and a light-emitting element, wherein the sub-pixel driving circuit comprises a drive transistor, a first reset transistor and a second reset transistor; a first electrode of the first reset transistor is coupled to a gate electrode of the drive transistor, and a second electrode of the first reset transistor is coupled to the first initialization signal line; a first electrode of the second reset transistor is coupled to the light-emitting element, and a second electrode of the second reset transistor is coupled to the second initialization signal line;

wherein at least part of the first initialization signal line extends in a first direction;

at least part of the second initialization signal line extends in the first direction;

the sub-pixel further comprises: a first compensation signal line and/or a second compensation signal line; the first compensation signal line is coupled to the first initialization signal line, at least part of the first compensation signal line extends in a second direction, the second direction intersecting the first direction; the second compensation signal line is coupled to the second initialization signal line, and at least part of the second compensation signal line extends in the second direction;

wherein the plurality of sub-pixels are distributed in an array, and in sub-pixels in the same row in the first direction, first initialization signal lines are coupled; in sub-pixels in the same column in the second direction, first compensation signal lines are coupled; and/or, in the sub-pixels in the same row in the first direction, second initialization signal lines are coupled; in the sub-pixels in the same column in the second direction, the second compensation signal lines are coupled.

2. The display substrate according to claim 1, wherein the sub-pixel further comprises:

a data line, at least part of the data line extending in the second direction;

in a same one of the sub-pixels, an orthographic projection of a gate electrode of the drive transistor onto the base substrate is located between an orthographic projection of the data line onto the base substrate and an orthographic projection of the first compensation signal line onto the base substrate.

3. The display substrate according to claim 2, wherein the first compensation signal line and the second compensation signal line are arranged in a same layer and made of a same material as the data line.

4. The display substrate according to claim 3, wherein the sub-pixel further comprises: a first reset signal line, and at least part of the first reset signal line extends in the first direction;

the first reset transistor comprises a first active pattern;

wherein the first active pattern comprises the first electrode and the second electrode of the first reset transistor;

the sub-pixel further comprises: a first conductive connecting part, and the first conductive connecting part comprises a first portion and a second portion; the first portion is coupled to the first initialization signal line and the first compensation signal line, and the second portion is coupled to the second electrode of the first reset transistor.

5. The display substrate according to claim 3, wherein the sub-pixel further comprises: a second reset signal line, and at least part of the second reset signal line extends in the first direction;

the second reset transistor comprises a second active pattern;

wherein the second active pattern comprises the first electrode and the second electrode of the second reset transistor;

the sub-pixel further comprises: a second conductive connecting part, the second conductive connecting part comprises a third portion and a fourth portion, the third portion is coupled to the second initialization signal line and the second compensation signal line, and the fourth portion is coupled to the second electrode of the second reset transistor;

the display substrate further includes a first source and drain metal layer; the second conductive connecting part is arranged in a same layer and made of a same material as the first source and drain metal layer.

6. The display substrate according to claim 5, wherein the first compensation signal line and the second compensation signal line are both arranged in a same layer and made of a same material as the first source and drain metal layer.

7. The display substrate according to claim 2, wherein the sub-pixel further comprises:

a data line, at least part of the data line extending in the second direction;

in a same one of the sub-pixels, an orthographic projection of the data line onto the base substrate is located between an orthographic projection of the gate electrode of the drive transistor onto the base substrate and an orthographic projection of the first compensation signal line onto the base substrate.

8. The display substrate according to claim 2, wherein the sub-pixel driving circuit further includes a storage capacitor, the storage capacitor includes a first plate and a second plate arranged opposite to each other; the sub-pixel further includes: a light-emitting control signal line;

an orthographic projection of the second plate onto the base substrate does not overlap the orthographic projection of the data line onto the base substrate; the orthographic projection of the second plate onto the base substrate does not overlap an orthographic projection of the light-emitting control signal line onto the base substrate.

9. The display substrate according to claim 2, wherein the sub-pixel further includes: a power supply line; the power supply line includes a first power supply pattern;

the sub-pixel further includes:

a compensation transistor including a third active pattern;

a storage capacitor, where the storage capacitor includes a first plate and a second plate that are oppositely arranged, the second plate includes a plate body and a plate shielding part;

an orthographic projection of the plate shielding part onto the base substrate does not overlap the orthographic projection of the first compensation signal line onto the base substrate; and/or the orthographic projection of the plate shielding part onto the base substrate does not overlap the orthographic projection of the second compensation signal line onto the base substrate; an orthographic projection of the first power supply pattern onto the base substrate partially overlaps the orthographic projection of the data line onto the base substrate.

10. The display substrate according to claim 1, wherein the display substrate comprises a display area and a peripheral area surrounding the display area; the display substrate further comprises:

a first initialization signal bus, wherein the first initialization signal bus is arranged in the peripheral area, at least part of the first initialization signal bus extends in the second direction, and the first initialization signal line is coupled to the first initialization signal bus; and/or a second initialization signal bus, wherein the second initialization signal bus is arranged in the peripheral area, at least part of the second initialization signal bus extends in the second direction, and the second initialization signal line is coupled to the second initialization signal bus.

11. The display substrate according to claim 10, wherein the first initialization signal bus surrounds the display area; the first compensation signal line is coupled to the first initialization signal bus; and/or the second initialization signal bus surrounds the display area; the second compensation signal line is coupled to the second initialization signal bus.

12. The display substrate according to claim 1, wherein the display substrate comprises a display area and a peripheral area surrounding the display area; the display substrate further comprises:

a first initialization signal bus, wherein the first initialization signal bus is arranged in the peripheral area, at least part of the first initialization signal bus extends in the first direction, and the first initialization signal line is coupled to the first initialization signal bus; and/or a second initialization signal bus, wherein the second initialization signal bus is arranged in the peripheral area, at least part of the second initialization signal bus extends in the first direction, and the second initialization signal line is coupled to the second initialization signal bus;

wherein the first initialization signal bus is closer to the display area relative to the second initialization signal bus.

13. The display substrate according to claim 1, wherein the first initialization signal line and the second initialization signal line are arranged in a same layer and made of a same material.

14. The display substrate according to claim 1, wherein the first compensation signal line and the second compensation signal line are arranged in the same layer and made of the same material.

15. The display substrate according to claim 1, wherein the first initialization signal line is arranged in a different layer from the first compensation signal line.

16. The display substrate according to claim 15, wherein the orthographic projection of the first compensation signal line onto the base substrate and the orthographic projection of the first initialization signal line onto the base substrate have a first overlap area, the first compensation signal line and the first initialization signal line are coupled through a first via hole, and an orthographic projection of the first via hole onto the base substrate is located within the first overlap area.

17. The display substrate according to claim 16, wherein the orthographic projection of the second compensation signal line onto the base substrate and the orthographic projection of the second initialization signal line onto the base substrate have a second overlap area, the second compensation signal line and the second initialization signal line are coupled by a second via hole.

18. The display substrate according to claim 1, wherein the first initialization signal lines and the first compensation signal lines forms a grid-like structure.

19. A display device, comprising a display substrate;

wherein the display substrate includes: a base substrate and a plurality of sub-pixels onto the base substrate, wherein the sub-pixel includes:

a first initialization signal line and a second initialization signal line, wherein a potential of a first initialization signal transmitted by the first initialization signal line is different from a potential of a second initialization signal transmitted by the second initialization signal line; and a sub-pixel driving circuit and a light-emitting element, wherein the sub-pixel driving circuit comprises a drive transistor, a first reset transistor and a second reset transistor; a first electrode of the first reset transistor is coupled to a gate electrode of the drive transistor, and a second electrode of the first reset transistor is coupled to the first initialization signal line; a first electrode of the second reset transistor is coupled to the light-emitting element, and a second electrode of the second reset transistor is coupled to the second initialization signal line;

wherein at least part of the first initialization signal line extends in a first direction;

at least part of the second initialization signal line extends in the first direction;

the sub-pixel further comprises: a first compensation signal line and/or a second compensation signal line; the first compensation signal line is coupled to the first initialization signal line, at least part of the first compensation signal line extends in a second direction, the second direction intersecting the first direction; the second compensation signal line is coupled to the second initialization signal line, and at least part of the second compensation signal line extends in the second direction;

wherein the plurality of sub-pixels are distributed in an array, and in sub-pixels in the same row in the first direction, first initialization signal lines are coupled; in sub-pixels in the same column in the second direction, first compensation signal lines are coupled; and/or, in the sub-pixels in the same row in the first direction, second initialization signal lines are coupled; in the sub-pixels in the same column in the second direction, the second compensation signal lines are coupled.

* * * * *